(12) United States Patent
Kanetake et al.

(10) Patent No.: US 12,491,600 B2
(45) Date of Patent: Dec. 9, 2025

(54) SUBSTRATE WARPAGE CORRECTION METHOD, COMPUTER STORAGE MEDIUM, AND SUBSTRATE WARPAGE CORRECTION APPARATUS

(71) Applicant: Tokyo Electron Limited, Tokyo (JP)

(72) Inventors: Nozomu Kanetake, Koshi (JP); Akihiro Kubo, Koshi (JP); Teruhiko Kodama, Koshi (JP); Taro Yamamoto, Koshi (JP); Yasushi Takiguchi, Koshi (JP); Yoshiki Okamoto, Koshi (JP); Hayato Hosaka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 958 days.

(21) Appl. No.: 16/977,935

(22) PCT Filed: Feb. 26, 2019

(86) PCT No.: PCT/JP2019/007238
§ 371 (c)(1),
(2) Date: Sep. 3, 2020

(87) PCT Pub. No.: WO2019/176522
PCT Pub. Date: Sep. 19, 2019

(65) Prior Publication Data
US 2021/0039221 A1    Feb. 11, 2021

(30) Foreign Application Priority Data

Mar. 12, 2018  (JP) .................................. 2018-044218

(51) Int. Cl.
*B24B 7/22*     (2006.01)
*B24B 19/02*    (2006.01)
(Continued)

(52) U.S. Cl.
CPC .............. *B24B 7/228* (2013.01); *B24B 19/02* (2013.01); *B24B 41/0475* (2013.01); *H01L 21/67219* (2013.01); *H01L 21/67225* (2013.01)

(58) Field of Classification Search
CPC ..... B24B 7/228; B24B 19/02; B24B 41/0475; B24B 37/005; B24B 37/07; B24B 37/042
See application file for complete search history.

(56) References Cited

U.S. PATENT DOCUMENTS

2002/0132571 A1* 9/2002 Gonda ..................... B24D 5/02
451/364
2010/0258911 A1* 10/2010 Nakayama ............ C30B 29/406
257/E29.089

(Continued)

FOREIGN PATENT DOCUMENTS

JP      S55-141731 A      11/1980
JP        05123965 A   *   5/1993
(Continued)

OTHER PUBLICATIONS

International Search Report of the International Searching Authority mailed Apr. 23, 2019 for the corresponding international patent application No. PCT/JP2019/007238 (and English translation).

*Primary Examiner* — Monica S Carter
*Assistant Examiner* — Christopher Soto
(74) *Attorney, Agent, or Firm* — Posz Law Group, PLC

(57) ABSTRACT

A substrate warpage correction method according to this disclosure corrects warpage of a substrate without performing a process on a front surface of the substrate. The substrate warpage correction method includes a surface roughening of performing a surface roughening process on a rear surface of the substrate using a surface roughening processing apparatus configured to be able to perform the surface roughening process on the rear surface of the sub- (Continued)

strate, to form grooves in the rear surface to thereby correct the warpage of the substrate.

20 Claims, 15 Drawing Sheets

(51) Int. Cl.
  *B24B 41/047* (2006.01)
  *H01L 21/67* (2006.01)

(56) References Cited

U.S. PATENT DOCUMENTS

| | | | | |
|---|---|---|---|---|
| 2012/0277897 | A1* | 11/2012 | Zhang | G05B 19/182 |
| | | | | 700/103 |
| 2013/0001766 | A1* | 1/2013 | Takyu | H01L 21/304 |
| | | | | 257/734 |
| 2015/0255355 | A1* | 9/2015 | Kodama | H01L 21/67288 |
| | | | | 700/121 |

FOREIGN PATENT DOCUMENTS

| | | | |
|---|---|---|---|
| JP | 2005-136167 A | | 5/2005 |
| JP | 2009-253143 A | | 10/2009 |
| JP | 2013004561 A | * | 1/2013 |
| JP | 2014213403 A | * | 11/2014 |
| JP | 2015-181145 A | | 10/2015 |

* cited by examiner (A)

(B)

(C)

SUBSTRATE WARPAGE CORRECTION METHOD, COMPUTER STORAGE MEDIUM, AND SUBSTRATE WARPAGE CORRECTION APPARATUS

CROSS-REFERENCE TO RELATED APPLICATIONS

This application is based upon and claims the benefit of priority of the prior Japanese Patent Application No. 2018-44218, filed in Japan on Mar. 12, 2018, the entire contents of which are incorporated herein by reference.

TECHNICAL FIELD

The present invention relates to a warpage correction method for correcting warpage of a substrate, a computer-readable storage medium, and a substrate warpage correction apparatus.

BACKGROUND ART

In a manufacturing process for a semiconductor device, for example, a photolithography process of sequentially performing a resist coating treatment of applying a resist solution onto a semiconductor wafer (hereinafter, referred to as a "wafer") as a substrate to form a resist film, exposure processing of exposing the resist film into a predetermined pattern, a heat treatment (post-exposure baking treatment) of chemically promoting the chemical reaction in the resist film after the exposure, and a developing treatment of developing the exposed resist film, is performed to form a predetermined resist pattern on the wafer. Then, an etching treatment is performed on a treatment film formed on the wafer, using the resist pattern as a mask, and thereafter a removal treatment of the resist film and so on are performed to form the treatment film in a predetermined pattern. By repeating the above formation of the resist pattern and etching treatment, multilayer thin films each having the predetermined pattern are formed on the wafer.

Incidentally, some wafers have warpage occurring due to the influence of pre-treatments such as film formation and etching. The occurrence of the warpage in the wafer causes such poor conditions that heat does not uniformly transfer from a hot plate to the wafer during the heat treatment of the wafer and that exposure cannot be performed with high accuracy during the exposure processing.

As the method of correcting the warpage of the wafer, Patent Document 1 discloses a method of correcting the warpage of the wafer by supporting the wafer by a carrier arranged between an upper surface plate and a lower surface plate, and driving and spinning the upper surface plate, the lower surface plate, and the carrier to perform processing of removing a curved portion and a protruding portion formed on the front surface and the rear surface of the wafer.

PRIOR ART DOCUMENT

Patent Document

Patent Document 1: Japanese Patent Publication No. 55-141731

DISCLOSURE OF THE INVENTION

Problems to be Solved by the Invention

However, since the treatment film in the predetermined pattern has been formed on the front surface of the wafer, or the treatment film is to be formed on the front surface of the wafer, the processing cannot be performed on the front surface of the wafer as in Patent Document 1.

The present invention has been made in view of the above points and has an object to appropriately correct the warpage of a substrate without performing a process on a front surface of the substrate.

Means for Solving the Problems

In order to attain the above object, one aspect of the present invention is a warpage correction method for correcting warpage of a substrate, the warpage correction method including a surface roughening of performing a surface roughening process on a rear surface of the substrate using a surface roughening processing apparatus configured to be able to perform the surface roughening process on the rear surface of the substrate, to form grooves in the rear surface to thereby correct the warpage of the substrate.

According to the one aspect, the process is performed only on the rear surface of the substrate and any process on the front surface of the substrate is unnecessary, so that the warpage of the substrate can be corrected without affecting the front surface of the substrate.

One aspect of the present invention according to another viewpoint is a computer-readable storage medium storing a program running on a computer of a controller configured to control a surface roughening processing apparatus to cause the surface roughening processing apparatus to perform the above substrate warpage correction method.

One aspect of the present invention according to still another viewpoint is a warpage correction apparatus for correcting warpage of a substrate configured to perform a surface roughening process on a rear surface of the substrate to form grooves in the rear surface to thereby correct the warpage of the substrate, the warpage correction apparatus including: a sliding member configured to rotate around a vertical axis in order to slide on the rear surface of the substrate to thereby perform a process; and a controller configured to decide a polishing pressure, a spin speed of the sliding member, a surface roughness of a contact surface of the sliding member with the rear surface of the substrate, and a process region, as process conditions in the surface roughening process, based on information representing a warpage state of the substrate.

Effect of the Invention

The present invention can appropriately correct the warpage of a substrate without performing a process on a front surface of the substrate.

EMBODIMENTS FOR CARRYING OUT THE INVENTION

Figure 1:
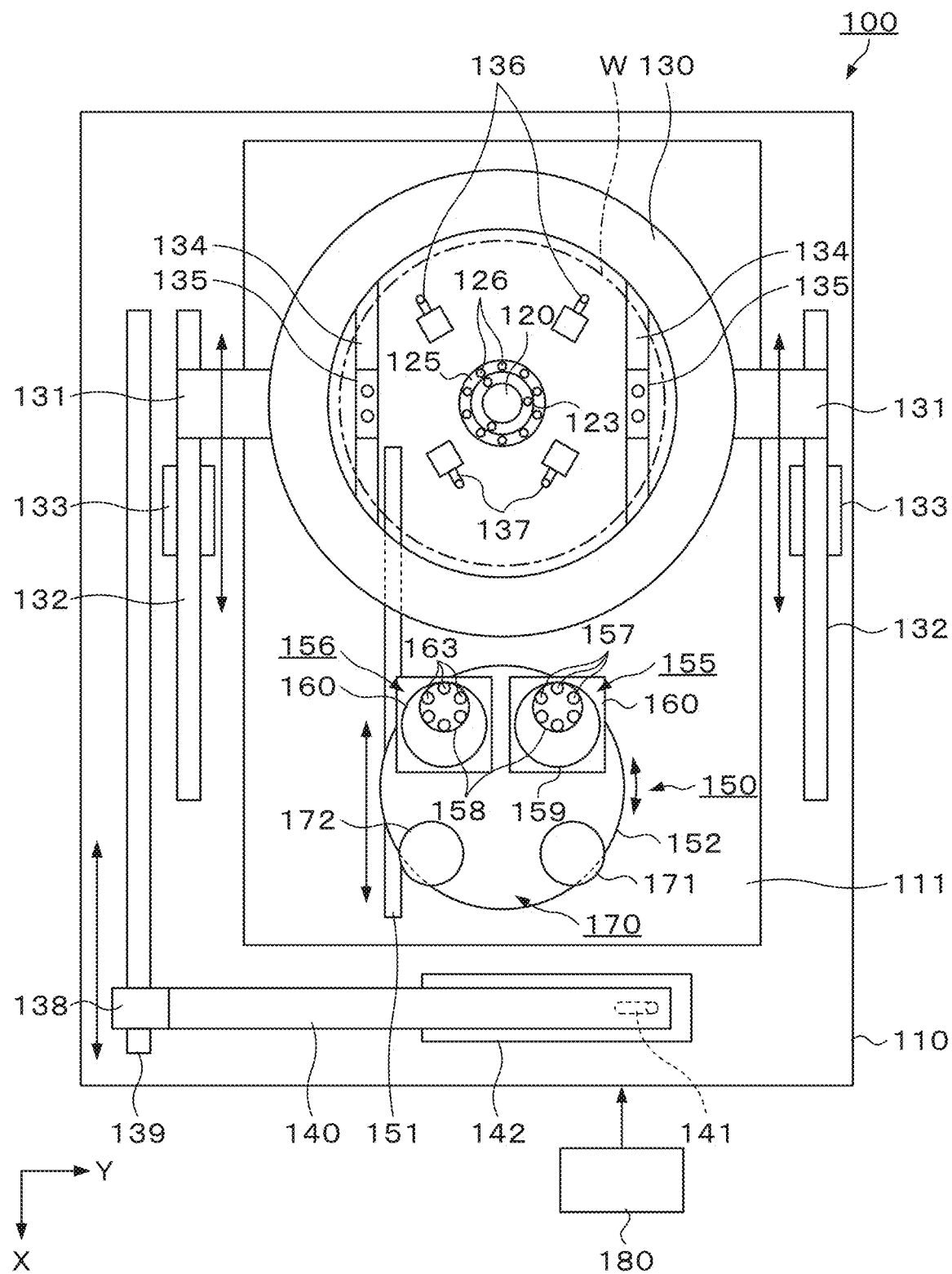
FIG. 1 is a plan view illustrating the outline of a configuration of a surface roughening processing apparatus according to an embodiment.

Hereinafter, embodiments will be explained referring to the drawings. Note that in this description and the drawings, the same codes are given to components having substantially the same functional configurations to omit duplicated explanation.

As explained above, if the substrate has warpage, a poor condition occurs.

Hence, the present inventors repeated earnest studies and, as a result, have found that there is a correlation between the surface roughening process by the surface roughening processing apparatus configured to be able to perform the surface roughening process on the entire rear surface of the wafer and the change in warpage of the wafer with respect to the surface roughening process, and thus arrived at correction of the warpage of the wafer using the surface roughening processing apparatus.

Figure 2:
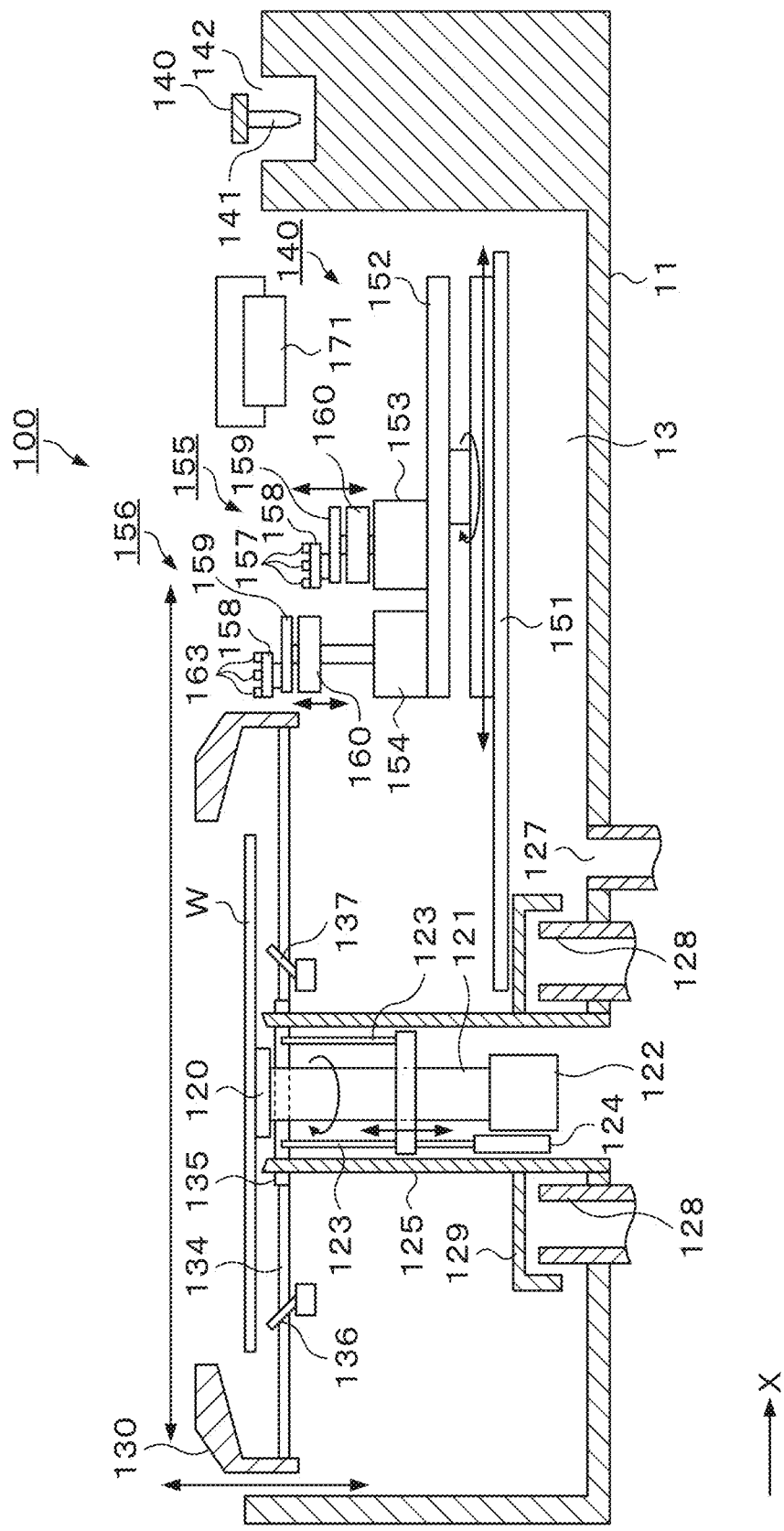
FIG. 2 is a longitudinal sectional view illustrating the outline of the configuration of the surface roughening processing apparatus according to the embodiment.

First, the configuration of a surface roughening processing apparatus (namely, a warpage correction apparatus) used for a wafer warpage correction method according to this embodiment will be explained. FIG. 1 and FIG. 2 are a plan view and a longitudinal sectional view illustrating the outline of a configuration of a surface roughening processing apparatus (warpage correction apparatus) 100, respectively.

The wafer being a processing object in the surface roughening processing apparatus 100 in this embodiment is, for example, a circular wafer in which at least an outermost surface of a rear surface is formed of a silicon layer. The wafer in which the outermost surface of the rear surface is formed of the silicon layer is larger, in change in warpage amount of the wafer with respect to the surface roughening process amount, than a wafer in which an outermost surface of a rear surface is formed of a layer harder than the silicon oxide layer such as a silicon nitride layer or a silicon oxide layer.

The surface roughening processing apparatus 100 slides a grindstone on the rear surface of the wafer W, in other words, polishes the rear surface of the wafer W by the grindstone to surface-roughen the rear surface.

Note that the surface roughening processing apparatus 100 can perform a cleaning treatment of scrubbing with a brush while supplying a cleaning solution to a region subjected to the above surface roughening to remove a foreign substance generated due to the surface roughening process.

The surface roughening processing apparatus 100 includes a base body 110, a spin chuck 120, a cup 130, a surface roughening and cleaning treatment part 150, a cleaning part 170, and various nozzles which supply pure water as a cleaning solution.

The base body 110 is formed in a rectangular shape in plan view, and the wafer W is transferred by a not-illustrated transfer mechanism provided outside the surface roughening processing apparatus 100 to the surface roughening processing apparatus 100 from the front side (an X-direction negative direction side in the drawing) of the base body 110. The base body 110 includes a square recessed part 111 having a longitudinal direction in the front-back direction (an X-direction in the drawing). On a front side (the X-direction negative direction side in the drawing) of the recessed part 111, the spin chuck 120 is provided.

The spin chuck 120 sucks a middle portion of the rear surface of the wafer W and horizontally holds the wafer W. The lower side of the spin chuck 120 is connected to a spin mechanism 122 via a shaft 121, and the spin mechanism 122 spins the spin chuck 120 so that the wafer W held by the spin chuck 120 is spun around a vertical axis.

Around the spin chuck 120, three vertical support pins 123 are arranged. The support pins 123 are configured to be freely raised and lowered by a raising and lowering mechanism 124, and can deliver the wafer W between the aforementioned transfer mechanism, and, the spin chuck 120 being a "second holder" and a later-explained fixing chuck 135 being a "first holder".

Further, an air knife 125 in a cylindrical shape extending upward from a bottom portion of the base body 110 is provided in a manner to surround the spin chuck 120, the spin mechanism 122, the support pins 123, and the raising and lowering mechanism 124. An upper end surface of the air knife 125 is formed of an inclined surface inclined inward. The inclined surface is provided with discharge ports 126 which discharge, for example, air upward. When the rear surface of the wafer W is suction-held on the spin chuck 120, the upper end of the air knife 125 is located close to the rear surface of the wafer W and air is discharged from the discharge ports 126 to prevent the cleaning solution from adhering to the middle portion of the rear surface of the wafer W. Further, by discharging air from the discharge ports 126, the middle portion of the rear surface of the wafer W can be dried.

Further, a drain port 127 for draining a waste solution dropping from the wafer W into the recessed part 111, is provided at the bottom portion of the recessed part 111 of the base body 110. At a position closer to the air knife 125 than the drain port 127, an exhaust pipe 128 exhausting the air in the recessed part 111 is provided. By exhausting air through the exhaust pipe 128 during the process of the wafer W, the cleaning solution scattering from the wafer W and shavings of the wafer W generated in the surface roughening process are prevented from scattering to the outside of the recessed part 111.

Further, a flange 129 covering an opening portion of the exhaust pipe 128 is provided at the air knife 125. The flange 129 suppresses inflow of the waste solution into the exhaust pipe 128.

The cup 130 surrounds the wafer W during the process, and suppresses scattering of the waste solution from the wafer W. The cup 130 is formed in a cylindrical shape having an upper end portion projecting inward in a manner to surround the air knife 125. From outer walls on the right and left (both ends in a Y-direction in the drawing) of the cup 130, supports 131 extend toward the top of the outer rim of the recessed part 111, respectively, and connected to horizontal moving mechanisms 132 provided on the base body 110. The cup 130 can be moved in the front-rear direction in the recessed part 111 by the horizontal moving mechanisms 132. Further, below the horizontal moving mechanisms 132, raising and lowering mechanisms 133 are provided, and the horizontal moving mechanisms 132, namely, the cup 130 can be raised and lowered by the raising and lowering mechanisms 133.

In the cup 130, two bridge parts 134 are provided which sandwich the spin chuck 120 from the right and left (both sides in the Y-direction in the drawing) and extend in the front-rear direction (the X-direction in the drawing). At the bridge parts 134, the fixing chucks 135 are provided. The fixing chucks 135 suck regions on the outer side of the middle portion of the rear surface of the wafer W to horizontally hold the wafer W. The fixing chucks 135 are used in processing the middle portion and so on of the rear surface of the wafer W. Note that the spin chuck 120 is used in processing the regions on the outer side of the middle portion of the rear surface of the wafer W.

Further, peripheral edge cleaning nozzles 136 are provided on a front side (the X-direction negative direction side in the drawing) of the cup 130, and rear surface cleaning nozzles 137 are provided on a rear side (an X-direction positive direction side in the drawing). The peripheral edge cleaning nozzles 136 discharge pure water toward a peripheral edge of the rear surface of the wafer W at the time when the wafer W is held on the spin chuck 120. The rear surface cleaning nozzles 137 discharge pure water toward the middle portion of the rear surface of the wafer W at the time when the wafer W is held on the fixing chucks 135, and discharge pure water toward the region on the outer side of the middle portion of the rear surface of the wafer W at the time when the wafer W is held on the spin chuck 120.

On the left side (a Y-direction negative direction side in the drawing) of the horizontal moving mechanism 132 for the cup 130, a moving mechanism 139 which moves a raising and lowering mechanism 138 in the front-rear direction (the X-direction in the drawing) is provided.

At the raising and lowering mechanism 138, an arm 140 which can be freely raised and lowered by the raising and lowering mechanism 138 is provided in a manner to extend to the right side (a Y-direction positive direction side in the drawing). At the tip of the arm 140, a front surface cleaning nozzle 141 is provided which discharges pure water to a central portion of the front surface of the wafer W held on the spin chuck 120.

Further, a waiting section 142 for the front surface cleaning nozzle 141 is provided on the rear side (the X-direction positive direction side in the drawing) of the recessed part 111 in the base body 110.

Next, the surface roughening and cleaning treatment part 150 will be explained. The surface roughening and cleaning treatment part 150 is composed of a horizontal moving mechanism 151, a spin mechanism 152, raising and lowering mechanisms 153, 154, a surface roughening mechanism 155, and a cleaning mechanism 156. The horizontal moving mechanism 151 is provided to extend in the front-rear direction (the X-direction in the drawing) in the recessed part 111. The spin mechanism 152 can be moved by the horizontal moving mechanism 151 in the front-rear direction (the X-direction in the drawing) from a rear end portion (a front side end portion in the X-direction in the drawing) in the recessed part 111 up to the front of the air knife 125.

Further, an upper part side of the spin mechanism 152 is configured as a horizontal circular stage, and this stage can spin around its vertical center axis. On the stage of the spin mechanism 152, the raising and lowering mechanisms 153, 154 are provided at an interval in a circumferential direction. The surface roughening mechanism 155 is provided on the raising and lowering mechanism 153 in a manner to be freely raised and lowered by the raising and lowering mechanism 153, and the cleaning mechanism 156 is provided on the raising and lowering mechanism 154 in a manner to be freely raised and lowered by the raising and lowering mechanism 154. The cooperation of the raising and lowering by the raising and lowering mechanisms 153, 154, the horizontal movement by the horizontal moving mechanism 151, and the spin by the spin mechanism 152, the surface roughening mechanism 155 and the cleaning mechanism 156 can be moved between the inside of the cup 130 and the outside of the cup 130. The horizontal moving mechanism 151, the horizontal moving mechanisms 132 connected with the cup 130, and the spin mechanism 122 spinning the spin chuck 120 constitute a "relative moving mechanism" according to the present invention.

Figure 3:
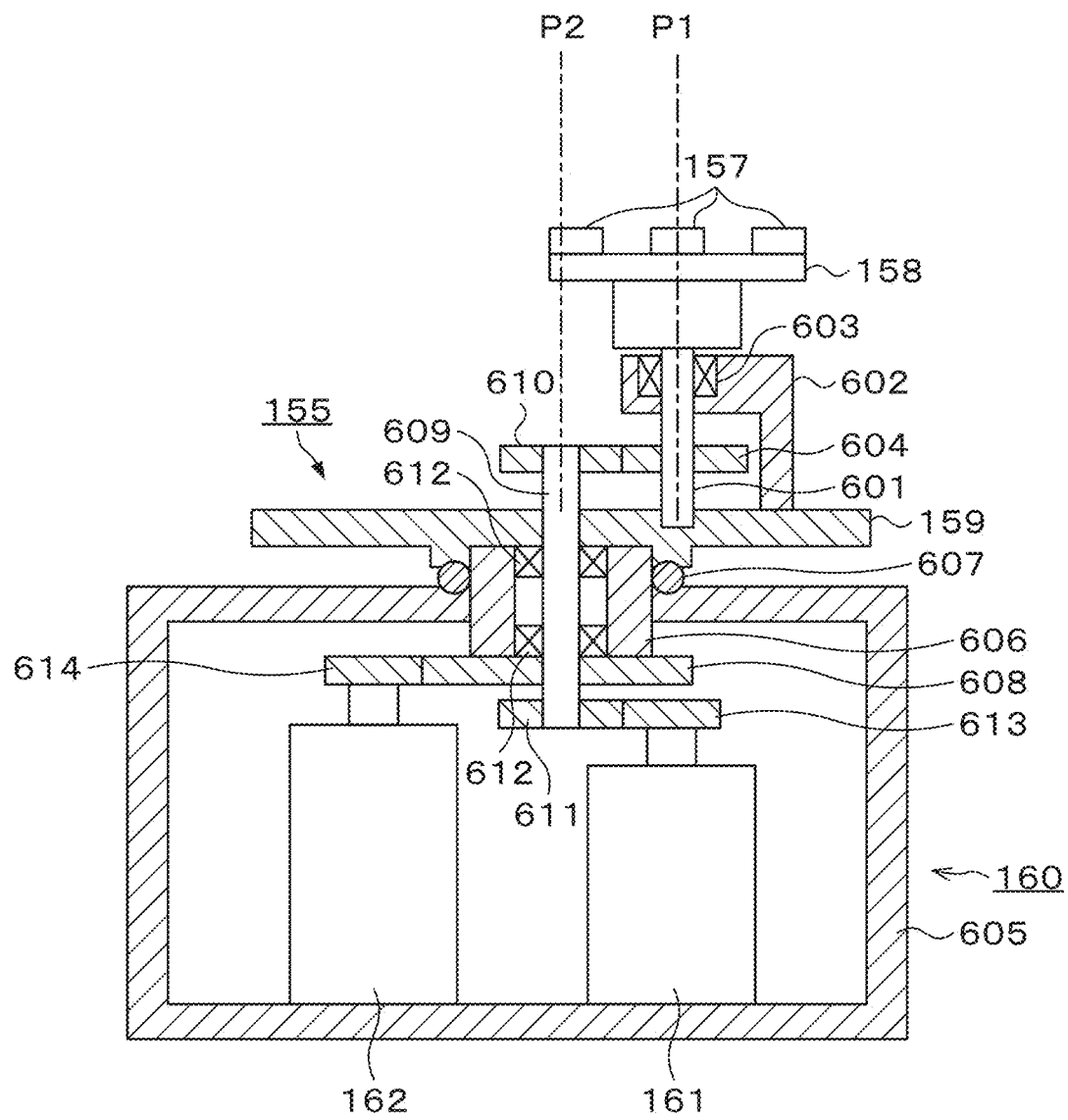
FIG. 3 is a longitudinal sectional view illustrating the outline of a configuration of a surface roughening mechanism of the surface roughening processing apparatus.

FIG. 3 is a longitudinal sectional view illustrating the outline of a configuration of the surface roughening mechanism 155.

The surface roughening mechanism 155 includes, as illustrated in FIG. 3, grindstones 157, a support plate 158, a revolution plate 159, and a drive unit 160 being a revolution mechanism. The support plate 158 is a horizontal circular plate, and six grindstones 157 are arranged at regular intervals along the circumferential direction of the support plate 158 on a peripheral portion of the support plate 158 (see FIG. 1). Note that the support plate 158 provided with the grindstones 157 corresponds to a "sliding member". The grindstone 157 is, for example, a diamond grindstone of a particle size (grain size) of #60000 and formed in a horizontal disk shape, and scratches the rear surface of the wafer W to thereby roughen the rear surface of the wafer W. Further, at the central portion of the rear surface of the support plate 158, a first vertical rotation shaft 601 is provided.

Further, the revolution plate 159 is a horizontal disk, and provided below the support plate 158. The revolution plate 159 is provided with a support part 602, and the support part 602 supports the first rotation shaft 601 on the revolution plate 159. The support part 602 includes a bearing 603 for supporting the first rotation shaft 601 to freely spin around a vertical axis P1. Further, the first rotation shaft 601 is provided with a gear 604 which spins around the vertical axis P1 as a spin axis.

A box 605 constituting the drive unit 160 is provided below the revolution plate 159. A vertical revolution cylinder 606 extending out from the central portion of the revolution plate 159 toward the inside of the box 605, and the revolution plate 159 is supported by a bearing 607 so as to be able to spin around a vertical axis P2 with respect to the box 605. A lower end portion of the revolution cylinder 606 is located inside the box 605, and is configured as a gear 608 spinning around the vertical axis P2 as a spin axis.

Further, a vertical second rotation shaft 609 is provided which penetrates the revolution cylinder 606. An upper end portion of the second rotation shaft 609 is constituted as a gear 610 which meshes with the gear 604 of the first rotation shaft 601. A lower end portion of the second rotation shaft 609 is constituted as a gear 611. The second rotation shaft 609 and the gears 610, 611 spin around the vertical axis P2 as a spin axis. Further, the revolution cylinder 606 is provided with bearings 612 which support the second rotation shaft 609 so as to be able to spin with respect to the revolution cylinder 606.

Inside the box 605, a rotation motor 161 and a revolution motor 162 constituting the drive unit 160 are provided, and a gear 613 provided at the rotation motor 161 is meshed with the gear 611 of the second rotation shaft 609, and a gear 614 provided at the revolution motor 162 is meshed with the gear 608 provided at the revolution cylinder 606. With this configuration, the support plate 158 and the revolution plate 159 spin independently from each other by the rotation motor 161 and the revolution motor 162, respectively. Accordingly, the support plate 158 can rotate around the vertical axis P1 and revolve around the vertical axis P2, and therefore the vertical axis P1 is described as a rotation axis and the vertical axis P2 is described as a revolution axis in some cases.

Figure 4:
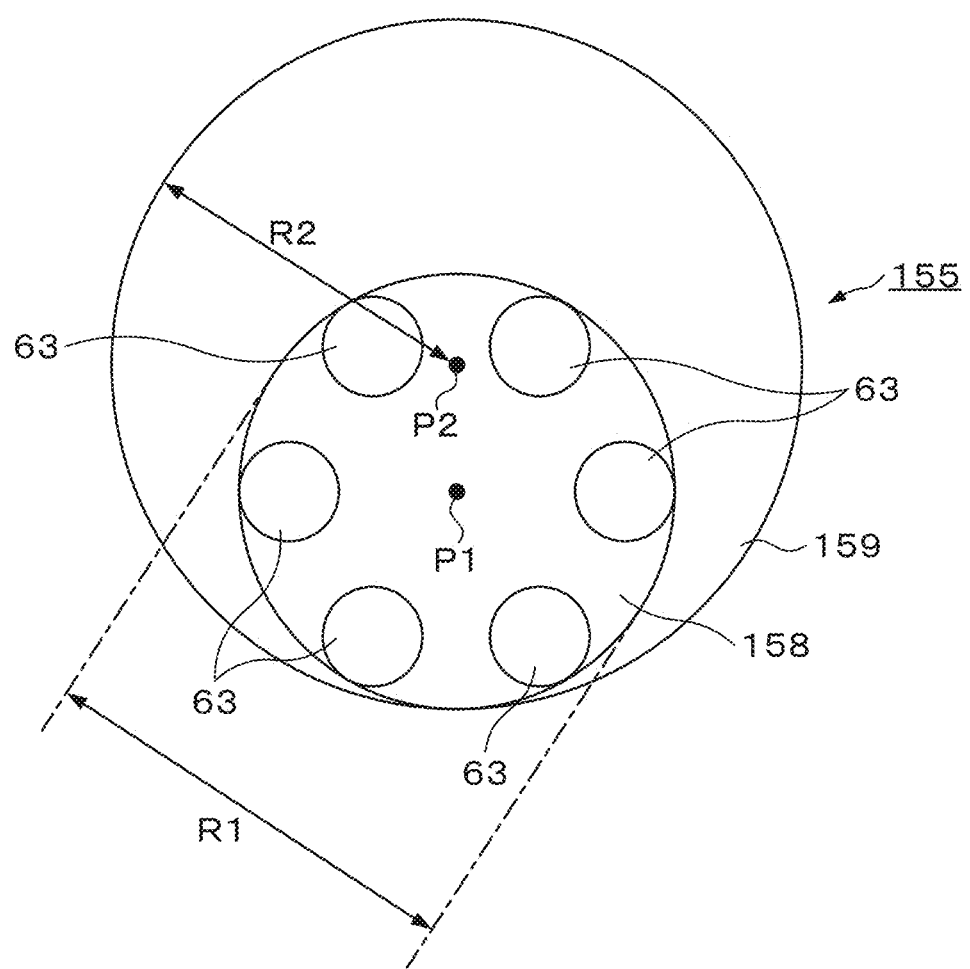
FIG. 4 is a plan view of the surface roughening mechanism in FIG. 3.

FIG. 4 is a top view of the surface roughening mechanism 155. As illustrated in the drawing, a diameter R1 of the support plate 158 is larger than a revolution radius R2 of the support plate 158. The surface roughening process of the rear surface of the wafer W is performed, for example, such that the support plate 158 rotates around the rotation axis P1 and repeatedly revolves around the revolution axis P2 while the grindstones 157 being in contact with the rear surface of the wafer W, whereby the grindstones 157 slide on the rear surface of the wafer W.

The surface roughening process of the middle portion of the rear surface of the wafer W can be performed by making the support plate 158 rotate and revolve as explained above while the wafer W is held still by the fixing chucks 135.

Further, the surface roughening process of the other than the middle portion of the rear surface of the wafer W can be performed, for example, by making the support plate 158 rotate and revolve as explained above while the wafer W is being spun by the spin chuck 120.

Note that in the surface roughening process of the rear surface of the wafer W, both the rotation and the revolution of the support plate 158 do not always need to be performed, and only the rotation or the revolution is performed in some cases.

By setting R1, R2 as explained above, the grindstones 157 pass through all of the regions inside the outer rim of the revolution orbit of the support plate 158. Therefore, even if the wafer W stands still, the surface roughening process of the whole middle portion of the rear surface of the wafer W can be performed by the arrangement that the revolution orbit of the support plate 158 is overlapped with the middle portion of the rear surface.

The cleaning mechanism 156 has substantially the same configuration as that of the surface roughening mechanism 155, and is different in that circular brushes 163 are provided, in place of the grindstones 157, on the support plate 158. The brushes 163 rub the rear surface of the wafer W to remove particles which are generated due to the surface roughening process and adhere to the rear surface of the wafer W.

Explanation is returned to FIG. 1 and FIG. 2,

The cleaning part 170 is provided on the rear side (the X-direction positive direction side in the drawing) in the recessed part 111 of the base body 110, and includes a grindstone cleaner 171 and a brush cleaner 172. The grindstone cleaner 171 is provided with a not-illustrated dresser composed of, for example, diamond, and performs dressing of the grindstones 157 to remove the shavings stuck in the grindstones 157 and performs setting of the grindstones 157. The brush cleaner 172 cleans the brushes 163.

Further, the surface roughening processing apparatus 100 includes a not-illustrated pure water supply source, and is configured such that pure water can be supplied from the pure water supply source independently to the peripheral edge cleaning nozzles 136, the rear surface cleaning nozzles 137, the front surface cleaning nozzle 141 and so on.

Further, the surface roughening processing apparatus 100 includes a controller 180 which controls the surface roughening processing apparatus 100.

The controller 180 is, for example, a computer and includes a program storage (not illustrated). The program storage stores a program for controlling operations of the parts of the surface roughening processing apparatus 100 to thereby control the process on the wafer W by the surface roughening processing apparatus 100. The program includes a program for controlling the drive mechanisms (the horizontal moving mechanism 151, the spin mechanism 152, the raising and lowering mechanism 15, the horizontal moving mechanism, the spin mechanism 122) relating to the sliding member composed of the support plate 158 and the grindstones 157 of the surface roughening processing apparatus 100 based on information representing the warpage state of the wafer W to perform the process of correcting the warpage of the wafer W. Note that the program may be the one which is recorded, for example, on a computer-readable storage medium such as a computer-readable hard disk (HD), flexible disk (FD), compact disk (CD), magneto-optical disk (MO), or memory card, and installed from the storage medium into the controller 180.

In the surface roughening processing apparatus 100, the support plate 158 and the grindstones 157 revolve while rotating, and the support plate 158 and the grindstones 157 rotate and revolve in a state where the wafer W is being spun. In other words, in the surface roughening process by the surface roughening processing apparatus 100, the rear surface of the wafer W is scratched from all directions by the grindstones 157, so that numerous fine acicular projections are formed on the rear surface of the wafer W. The height from the tip end to the base end of the fine acicular projection formed by the surface roughening process is, for example, 50 nm or less.

The above surface roughening processing apparatus 100 is intended to form the fine acicular projections on the entire rear surface of the wafer W to uniformly roughen the rear surface. In the warpage correction method for the wafer W according to this embodiment, the surface roughening processing apparatus 100 may be used to form the fine acicular projections at a part of the rear surface of the wafer W to roughen the part.

As explained above, the present inventors have found the correlation between the surface roughening process by an apparatus such as the surface roughening processing apparatus 100 configured to be capable of roughening the entire rear surface of the wafer W and the change in warpage of the wafer with respect to the surface roughening process, and therefore arrived at the correction of the warpage of the wafer W by performing the surface roughening process by the surface roughening processing apparatus 100.

Figure 5:
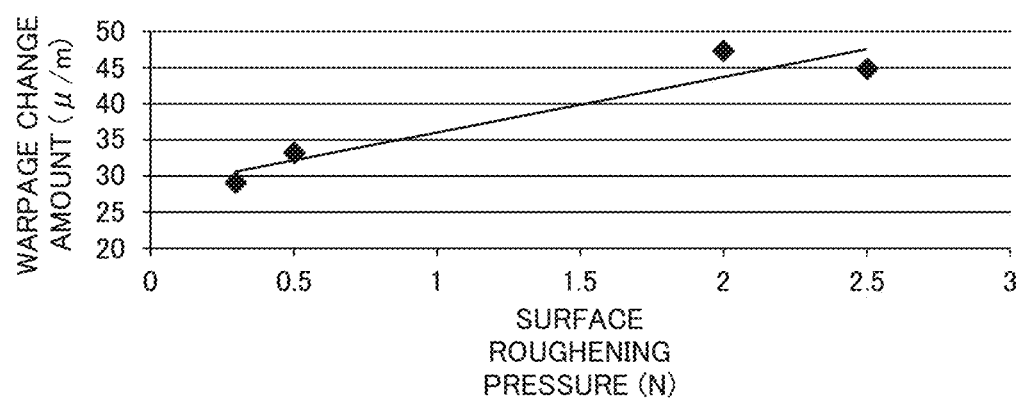
FIG. 5 is a chart illustrating a correlation between a surface roughening pressure in the surface roughening process and a change in warpage of a wafer with respect to the surface roughening process.

FIG. 5 is a chart illustrating that there is a correlation between a surface roughening pressure (polishing pressure) in the surface roughening process, namely, the pressure of pressing the grindstones 157 against the wafer W and the change in warpage of the wafer W with respect to the surface roughening process.

The present inventors carried out a central surface roughening process and an outer-peripheral surface roughening process on a plurality of flat wafers W with the surface roughening pressure in both of the processes made different for each of the wafers W, and measured the warpage of the wafer W in each region on the wafer W before both of the processes and the warpage of the wafer W in each region on the wafer W after both of the processes. Note that the diameter of the wafer W used is 300 mm. FIG. 4 illustrates the relation between the surface roughening pressure in the central surface roughening process and the outer-peripheral surface roughening process, and the change amount in warpage of the wafer W due to both of the processes.

The horizontal axis in FIG. 5 indicates the surface roughening pressure common in the central surface roughening process and the outer-peripheral surface roughening process, and the vertical axis indicates the change amount in warpage of the wafer W due to both of the processes which is the maximum change amount within each of the wafers W. Note that a larger change amount in warpage of the wafer W due to both of the processes represents larger warpage to the rear surface side of the wafer W.

Note that in this description, the "central surface roughening process" means a process performed by aligning the revolution axis P2 with the center of the wafer W and making the wafer W stand still while being suction-held by the fixing chucks 135, bringing the grindstones 157 into contact with the rear surface of the wafer W, and making the support plate 158 supporting the grindstones 157 rotate around the rotation axis P1 and revolve around the revolution axis P2, thereby sliding the grindstones 157 on the rear surface of the wafer W.

Besides, in this description, the "outer-peripheral surface roughening process" means a process performed targeting on the region on the rear surface of the wafer W including at least the region on the outer side of the region which is processed by the central surface roughening process, and performed by suction-holding the wafer W spun by the spin chuck 120, and making the support plate 158 not rotate but revolve while bringing the grindstones 157 into contact with the rear surface of the wafer W.

Further, the "flat wafer W" in this description means that the warpage of the wafer W falls within a range of ±10 μm on the entire surface of the wafer W.

Note that the process conditions other than the surface roughening pressure when the correlation in FIG. 5 was obtained are as follows A rotation speed and a revolution speed of the support plate 158 in the central surface roughening process were 1 rpm and 200 rpm respectively, and a revolution speed of the support plate 158 and a wafer spin speed in the outer-peripheral surface roughening process were 1 rpm and 600 rpm, respectively.

When the surface roughening pressure in the surface roughening process was made different for each of the wafers W, though not illustrated, the shape of the wafer W after the surface roughening process was a concave shape concaved to the rear surface side of the wafer W in all of the wafers W, and the region with the maximum change amount in warpage of the wafer W due to the surface roughening process was near the center.

Further, as illustrated in FIG. 5, the surface roughening pressure in the surface roughening process and the maximum change amount in warpage of the wafer W due to the surface roughening process are in such a correlation that when the surface roughening pressure increases, the maximum change amount increases.

From the above, it is obvious that there is a correlation between the surface roughening pressure in the surface roughening process using the surface roughening processing apparatus 100 and the change amount in warpage of the wafer W in a direction of being concaved to the rear surface side.

Note that the control of the surface roughening pressure can be performed via the raising and lowering mechanism 153.

Figure 6:
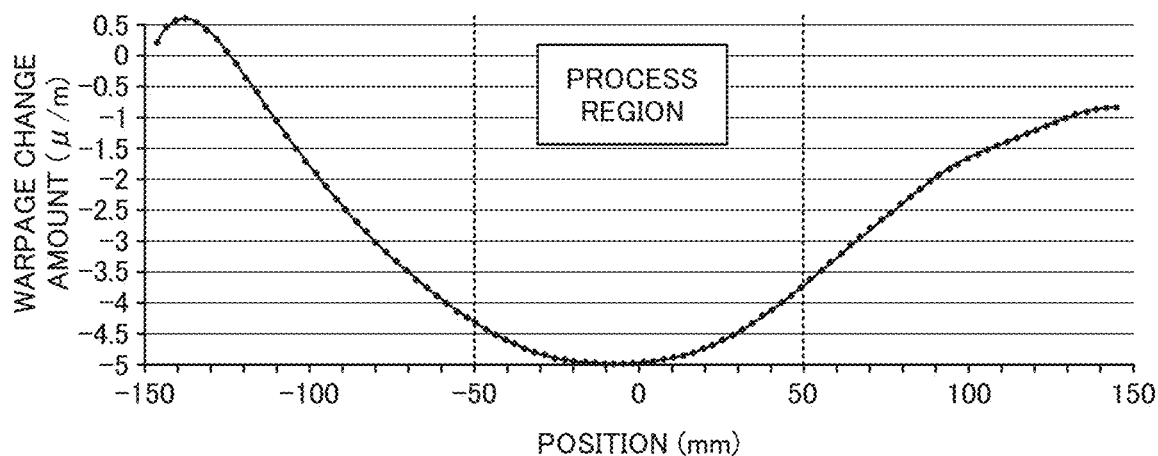
FIG. 6 is a chart illustrating a change amount in warpage of the wafer in the case where a middle region of the wafer was subjected to the surface roughening process.
Figure 7:
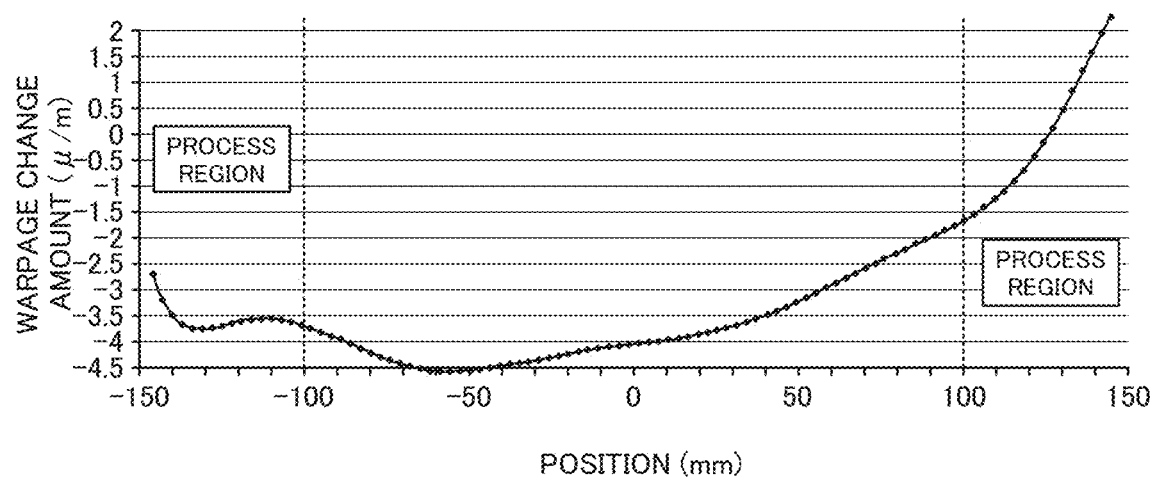
FIG. 7 is a chart illustrating the change amount in warpage of the wafer in the case where an outer peripheral region of the wafer was subjected to the surface roughening process.

FIG. 6 is a chart illustrating the change amount in warpage of the wafer W in the case where the middle region of the wafer W was subjected to the surface roughening process, and FIG. 7 is a chart illustrating the change amount in warpage of the wafer W in the case where the outer peripheral region of the wafer W was subjected to the surface roughening process.

Note that to obtain the results in FIG. 6 and FIG. 7, a wafer W having a diameter of 300 mm was used. Further, the surface roughening process region when obtaining the result in FIG. 6 was a circular region of 50 mm from the center of the wafer W, and the surface roughening process region in FIG. 7 was a ring shape region surrounded by a portion separated by 100 mm from the center of the wafer W and the outer peripheral edge of the wafer W.

The vertical axes in FIG. 6 and FIG. 7 indicate the change amount in warpage of the wafer W due to the surface roughening process, and when the warpage amount changes in the direction in which the wafer W is concaved to the rear surface side, its value becomes negative. Besides, the horizontal axes in FIG. 6 and FIG. 7 indicate the position of each of portions where the change amount was measured using the center of the wafer as a reference point.

As illustrated in FIG. 6 and FIG. 7, the region where the surface roughening process was performed is concaved to the rear surface side of the wafer W by performing the surface roughening process except for the region separated by 120 mm or more from the center of the wafer W in FIG. 6.

This shows that the region where the surface roughening process was performed is concaved to the rear surface of the wafer W irrespective of the position of the region within the wafer W, in other words, irrespective of whether the region is the center region of the wafer W or the peripheral region of the wafer W.

Since there is the concave as above and the correlation between the surface roughening pressure in the surface roughening process using the surface roughening processing apparatus 100 and the change amount in warpage of the wafer W in the direction of being concaved to the rear surface side due to the surface roughening process, the processing on the wafer W is performed as follows in the warpage correction method for the wafer W using the surface roughening processing apparatus 100 according to this embodiment.

First Embodiment

Figure 8:
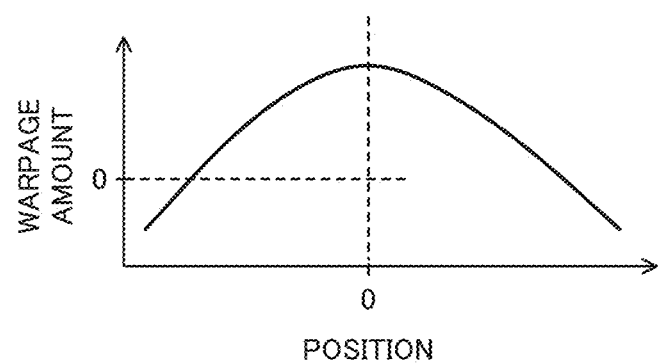
FIG. 8 is an explanatory chart of one example of the wafer being a correction object of a wafer warpage correction method according to a first embodiment.

FIG. 8 is an explanatory chart of the wafer W being an object of the wafer processing in this embodiment. The vertical axis indicates the distance from a reference plane of each of regions of the wafer W before the surface roughening process in the region, namely, the warpage amount, and in a region where the wafer W is located on the front surface side from the reference plane, the value of the region becomes positive. Further, the horizontal axis indicates the position of each of the regions with the center of the wafer as a reference point.

When it has been proved that the wafer W being a processing object is a wafer W having a shape in an inverted U-shape in a cross-sectional view and its center most protruding to the front surface side as illustrated in FIG. 8, for example, the following process is performed on the wafer W in the warpage correction method according to this embodiment.

(Warpage Amount Acquisition)

The controller 180 of the surface roughening processing apparatus 100, for example, extracts and acquires the information about the warpage amount of the wafer W being the processing object, where the information is stored in advance in the not-illustrated storage. The warpage amount is, for example, the warpage amount of the portion most protruding to the front surface side relating to the wafer W being the processing object or may be an average value of the warpage amounts of portions protruding to the front surface side relating to the wafer W being the processing object. Note that the information about the warpage amount has been stored in advance in this example, but the warpage amount of the wafer W may be actually measured using the distance sensor or the like inside or outside the surface roughening processing apparatus 100 and the measured result may be used.

(Surface Roughening Pressure Decision)

The controller 180 decides the surface roughening pressure in the surface roughening process of the wafer W based on the acquired information about the warpage amount. An example of the method of deciding the surface roughening pressure is a method of calculating the surface roughening pressure based on the above acquired information about the warpage amount by using a calculation expression for the surface roughening pressure using the warpage amount as a variable, and deciding the calculated surface roughening pressure as the surface roughening pressure in the surface roughening process. Besides, another example of the deciding method is a method of storing in advance a correspondence table between the warpage amount and the surface roughening pressure in the not-illustrated storage, and deciding the surface roughening pressure using the correspondence table.

Note that the above warpage amount acquisition step and surface roughening pressure decision step may be performed before, after, or in parallel with a later-explained wafer transfer step.

(Wafer Transfer-In)

The wafer W is transferred to the surface roughening processing apparatus 100 by the transfer mechanism outside the surface roughening processing apparatus 100 in a state where the surface roughening mechanism 155 is located, for example, at a waiting position (a position illustrate in FIG. 1) on the rear side in the recessed part 111 of the base body 110 and the cup 130 is located at a reference position (a position illustrate in FIG. 1) where its center is overlapped with the center of the spin chuck 120. When the central portion of the wafer W is located above the spin chuck 120, the support pins 123 are raised to support the wafer W. Then, the cup 130 is raised so that the fixing chucks 135 are located at a position higher than the spin chuck 120, then the support pins 123 are lowered to deliver the wafer W to the fixing chucks 135, and the peripheral region of the rear surface of the wafer W is suction-held by the fixing chucks 135. Subsequently, the cup 130 is moved to the rear so that the middle portion of the wafer W is located at the rear of the air knife 125.

(Roughening)

Next, the surface roughening mechanism 155 is made to advance and move to the inside of the cup 130. Then, the surface roughening mechanism 155 is raised, and the grindstones 157 are pressed against the rear surface of the wafer W in a state where the revolution axis P2 of the surface roughening mechanism 155 is overlapped with the center of the wafer W and at the pressure decided at the surface roughening pressure decision step, and then the support plate 158 of the surface roughening mechanism 155 is made to rotate and revolve to thereby subject the middle portion of the wafer W to the surface roughening process by the grindstones 157. By the rotation and revolution of the support plate 158, grooves are formed at portions within the middle portion of the rear surface of the wafer W by repeated scratch by the grindstones 157 from directions different from one another.

(Wafer Transfer-Out)

After the surface roughening process, the rotation and revolution of the support plate 158 of the surface roughening mechanism 155 are stopped, the surface roughening mechanism 155 is lowered to separate the grindstones 157 from the rear surface of the wafer W. Then, the surface roughening mechanism 155 is made to retreat to the waiting position.

Thereafter, the support pins 123 are raised to thrust up the wafer W from the fixing chucks 135 to deliver the wafer W to the aforementioned transfer mechanism, and the wafer W is transferred out of the surface roughening processing apparatus 100.

Note that it is preferable to perform cleaning by the cleaning mechanism 156 for the middle portion of the wafer W between the surface roughening step and the wafer transfer-out step.

According to this embodiment, the surface roughening process is performed on the middle portion of the rear surface of the wafer W using the surface roughening processing apparatus 100 to form the grooves at the middle portion, thereby correcting the warpage of the wafer W and eliminating the need to perform a process on the front surface of the wafer W. This can correct the warpage of the wafer W without affecting the front surface of the wafer W.

Further, according to this embodiment, the wafer W can be appropriately flattened since the surface roughening process is performed at the surface roughening pressure according to the warpage amount to the front surface side of the wafer W, based on the knowledge that there is a correlation between the surface roughening pressure in the surface roughening process and the change amount in warpage of the wafer W in the direction of being concaved to the rear surface side due to the surface roughening process.

In the warpage correction method for the wafer W in Patent Document 1, in order to flatten the wafer W with a warpage of several tens of micrometers, the wafer W needs to be removed in units of several tens of micrometers. In contrast to this, in this embodiment, the wafer W with a warpage of several tens of micrometers can be flattened by forming fine projections of 50 nm or less, namely, scraping the rear surface of the wafer W in units of several tens of micrometers. Therefore, this embodiment can correct the warpage of the wafer W while keeping the strength of the wafer W.

Second Embodiment

Figure 9:
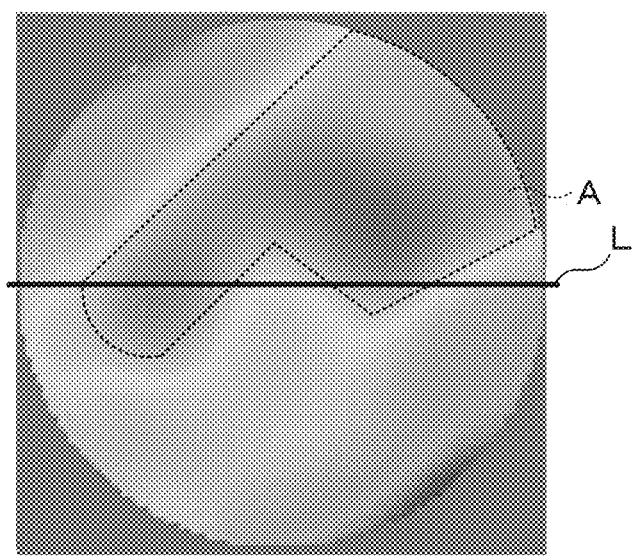
FIG. 9 is an explanatory view of the wafer being a correction object of a wafer warpage correction method according to a second embodiment.
Figure 10:
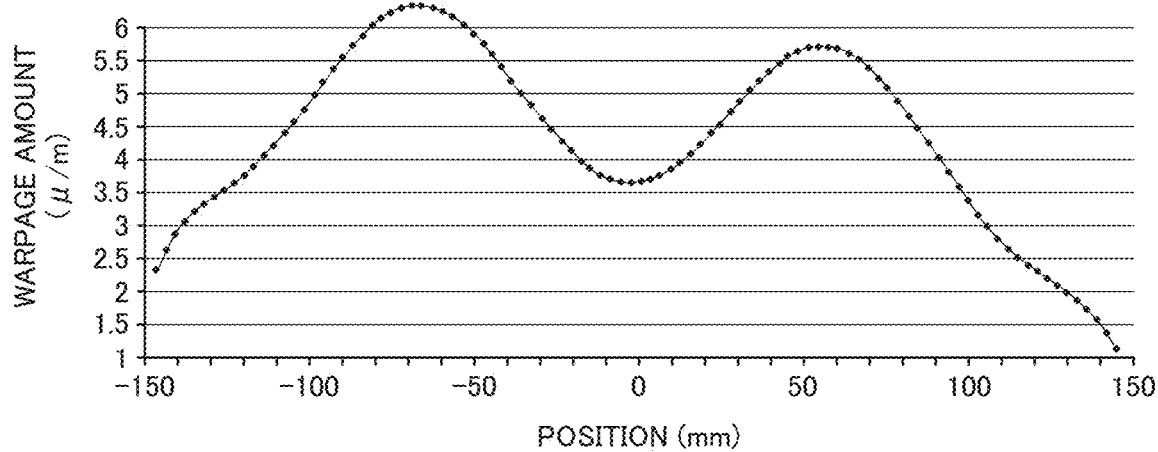
FIG. 10 is another explanatory chart of the wafer being the correction object of the wafer warpage correction method according to the second embodiment.

FIG. 9 and FIG. 10 are a view and a chart illustrating another example of the wafer W, and FIG. 9 is a plan view of the wafer W indicating the distance from the reference plane in each of regions within the wafer W by gradation such that a larger amount of protruding to the front surface side from the reference plane is indicated in a darker color. FIG. 10 is a chart illustrating the relation between the distance from the reference plane of each of regions of the wafer W of an L portion with a solid line in FIG. 9 and the position of the region.

The wafer W illustrated in FIG. 9 and FIG. 10 has a shape protruding to the front surface side, in which a region with a large protrusion amount to the front surface side is not the middle portion of the wafer W but is, concretely, a region A surrounded by a dotted line.

The wafer processing in the first embodiment is performed when the center of the wafer W being a processing object most protrudes to the front surface side as illustrated in FIG. 8, in other words, when a region with a large protrusion amount to the front surface side is the middle portion of the wafer W. When the wafer W being a processing object has the shape protruding to the front surface side as illustrated in FIG. 9 and FIG. 10 and the region with the large protrusion amount to the front surface side is not the middle portion of the wafer W but the peripheral portion of the wafer W, the following wafer processing is performed.

(Warpage Distribution Acquisition)

In the wafer processing in this embodiment, the controller 180 of the surface roughening processing apparatus 100 acquires, for example, information about the distribution of the warpage of the wafer W within the wafer W being a processing object, in other words, information from the reference plane of each of regions of the wafer W being a processing object in the region. The information about the distribution of the warpage of the wafer W may be acquired by the controller 180 extracting the information stored in advance in the not-illustrated storage, or generated and acquired by the controller 180 based on a measured result obtained by actually measuring the warpage amount of the wafer W using the distance sensor or the like inside or outside the surface roughening processing apparatus 100. The information about the distribution may be created in an external part of the surface roughening processing apparatus 100 based on the measured result, and may be acquired from the external part by the controller 180.

(Surface Roughening Process Region Decision)

The controller 180 decides the region within the rear surface of the wafer W on which the surface roughening process is to be performed (hereinafter, referred to as a surface roughening process region), based on the acquired information about the distribution of the warpage of the wafer W. For example, the region having a shape protruding to the front surface side and having a maximum protrusion amount of a predetermined value or more within the wafer W is decided as the surface roughening process region. In the following, explanation will be made on the assumption that the region A in FIG. 9 is decided as the surface roughening process region.

(Warpage Amount Acquisition)

Next, the controller 180 acquires the information about the warpage amount of the wafer W in the surface roughening process region. The warpage amount is, for example, the warpage amount of a portion most protruding to the front surface side in the surface roughening process region, or may be an average value of the warpage amounts of the wafer W in the surface roughening process region. Note that the information about the warpage amount may be stored in advance, or the warpage amount of the wafer W may be actually measured using the distance sensor or the like inside or outside the surface roughening processing apparatus 100 and the measured result may be used.

(Surface Roughening Pressure Decision)

The controller 180 decides the surface roughening pressure in the surface roughening process based on the above acquired information about the acquired warpage amount.

Note that the above warpage distribution acquisition step, surface roughening process region decision step, warpage amount acquisition step, and surface roughening pressure decision step may be performed before, after, or in parallel with the later-explained wafer transfer step.

(Wafer Transfer-In and Wafer Angle Adjustment)

The wafer W is transferred to the surface roughening processing apparatus 100 by the transfer mechanism outside the surface roughening processing apparatus 100 in a state where the surface roughening mechanism 155 is located, for example, at the waiting position on the rear side in the recessed part 111 of the base body 110 and the cup 130 is located at the reference position where the center of the cup 130 is overlapped with the center of the spin chuck 120. When the central portion of the wafer W is located above the spin chuck 120, the support pins 123 are raised to support the wafer W. Then, in a state where the spin chuck 120 is located at a position higher than the fixing chucks 135, the support pins 123 are lowered to deliver the wafer W to the spin chuck 120 and the middle region of the wafer W is suction-held by the spin chuck 120.

Thereafter, the spin chuck 120 is spun once, and a notch formed at the periphery of the wafer W is detected by a not-illustrated notch detection mechanism. Then, the spin chuck 120 is spun based on the detection result to adjust the orientation/angle of the wafer W so that the notch is oriented in a predetermined direction. This aligns the coordinate axes in the distribution of the warpage of the wafer W with the coordinate axes of the drive mechanism for the grindstones 157.

(Surface Roughening)

Next, the surface roughening mechanism 155 is made to advance and move to the inside of the cup 130. Then, the rotation of the support plate 158 and/or the spin of the wafer W, namely, the spin chuck 120 is performed to locate the rotation axis P1 of the surface roughening mechanism at the position overlapped with the region A of the wafer W. Then, in this state, the surface roughening mechanism 155 is raised and the grindstones 157 are pressed against the rear surface of the wafer W at the pressure decided at the surface roughening pressure decision step, and then the support plate 158 of the surface roughening mechanism 155 is made to rotate, and the revolution of the support plate 158 and/or the reciprocation turn in a predetermined range of the wafer W is performed, thereby subjecting a region including at least the region A of the rear surface of the wafer W to surface roughening process by the grindstones 157. By the rotation of the support plate 158 and the revolution of the support plate 158 and/or the reciprocation turn in a predetermined range of the wafer W, grooves are formed by repeated scratch by the grindstones 157 from directions different from one another, at portions in the region including the region A of the wafer W.

Note that when the surface roughening process region is a ring shape region concentric with the wafer W, the wafer W is continuously spun in the surface roughening process. Further, when the surface roughening process region includes the middle portion of the wafer W, the wafer W is held by the fixing chucks 135 and continuously spun as in the first embodiment in the surface roughening process of the middle portion.

Wafer Transfer-Out

After the surface roughening process, the rotation of the support plate 158 of the surface roughening mechanism 155 is stopped, the revolution of the support plate 158 and/or the turn of the wafer W, namely, the spin chuck 120 is stopped, and the surface roughening mechanism 155 is lowered to separate the grindstones 157 from the rear surface of the wafer W. Then, the surface roughening mechanism 155 is made to retreat to the waiting position.

Thereafter, the support pins 123 are raised to thrust up the wafer W from the spin chuck 120 to deliver the wafer W to the aforementioned transfer mechanism, and the wafer W is transferred out of the surface roughening processing apparatus 100.

Note that it is preferable to perform cleaning on the wafer W by the cleaning mechanism 156 between the surface roughening step and the wafer transfer-out step.

According to the wafer processing in this embodiment, even when the processing object is the wafer W in which the region with the large protrusion amount to the front surface side is not the middle portion of the wafer W but is the peripheral portion of the wafer W, the wafer W can be appropriately flattened.

Modification Examples of the First and Second Embodiments

In the above example, the surface roughening process is performed at the surface roughening pressure according to the warpage amount of the wafer W in the surface roughening process region. According to the research by the present inventors, not only the surface roughening pressure among the surface roughening process conditions has a correlation with the change in warpage of the wafer W with respect to the surface roughening process.

Figure 11:
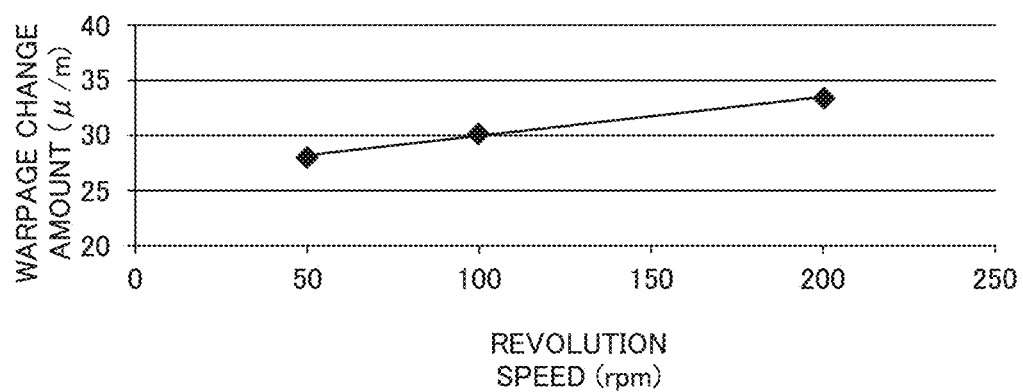
FIG. 11 is a chart illustrating a correlation between a revolution speed in the surface roughening process and the change in warpage of the wafer with respect to the surface roughening process.

FIG. 11 is a chart illustrating that there is a correlation between the revolution speed of the support plate 158 in the surface roughening process, more specifically, the revolution speed of the support plate 158 in the central surface roughening process and the change amount in warpage of the wafer W due to the process.

The present inventors carried the central surface roughening process and the outer-peripheral surface roughening process on a plurality of flat wafers W with the revolution speed of the support plate 158 in the central surface roughening process made different for each of the wafers W, and measured the warpage of the wafer W in each of regions on the wafer W before both of the processes and the warpage of the wafer W in each of the regions on the wafer W after both of the processes. FIG. 11 indicates the relation between the revolution speed of the support plate 158 in the central surface roughening process and the change amount in warpage of the wafer W due to both of the processes.

The horizontal axis of FIG. 11 indicates the revolution speed in the central surface roughening process and the vertical axis indicates the change amount in warpage of the wafer W due to the surface roughening process which is the maximum change amount within each of the wafers W. Note that a larger change amount in warpage of the wafer W due to the surface roughening process represents larger warpage to the rear surface side of the wafer W.

Note that process conditions other than the revolution speed when the correlation in FIG. 11 was obtained are as follows. The rotation speed of the support plate 158 and the surface roughening pressure in the central surface roughening process are 1 rpm and 0.5 N respectively, and the revolution speed of the support plate 158, the wafer spin speed, and the surface roughening pressure in the outer-peripheral surface roughening process were 1 rpm, 600 rpm and 0.5 N, respectively.

When the revolution speed of the support plate 158 in the central surface roughening process is made different for each of the wafers W, though not illustrated, the shape of the wafer W after the surface roughening process was a concave shape concaved to the rear surface side of the wafer W in all of the wafers W, and the region with the maximum change amount in warpage of the wafer W before and after the surface roughening process was near the center of the wafer W.

Further, as illustrated in FIG. 11, the revolution speed of the support plate 158 in the central surface roughening process and the maximum change amount in warpage of the wafer W due to the surface roughening process are in such a correlation that when the revolution speed increases, the maximum change amount increases.

From the above, it is obvious that there is a correlation between the revolution speed of the support plate 158 in the surface roughening process using the surface roughening processing apparatus 100 and the change amount in warpage of the wafer W in the direction of being concaved to the rear surface side.

Accordingly, in the above wafer processing, instead of performing the surface roughening process at the surface roughening pressure according to the magnitude of the warpage of the wafer W, the surface roughening process may be performed at the revolution speed of the support plate 158 according to the magnitude of the warpage of the wafer W. Also in this case, the wafer W can be appropriately flattened irrespective of the magnitude of the warpage of the wafer W.

In the viewpoint of generating a relative slide direction speed between the wafer W and the grindstones 157, not only the revolution speed of the support plate 158 but also the spin speed of the wafer W may be adjusted. In other words, instead of performing the surface roughening process at the revolution speed of the support plate 158 according to the magnitude of the warpage of the wafer W, the surface roughening process may be performed at the spin speed of the wafer W according to the magnitude of the warpage of the wafer W, or the surface roughening process may be performed at the revolution speed of the 158 and the spin speed of the wafer W according to the magnitude of the warpage of the wafer W.

Other Modification Examples of the First and Second Embodiments

According to the research by the present inventors, not only the surface roughening pressure and the revolution speed of the 158 among the surface roughening process conditions have the correlation with the change amount in warpage of the wafer W with respect to the surface roughening process.

Figure 12:
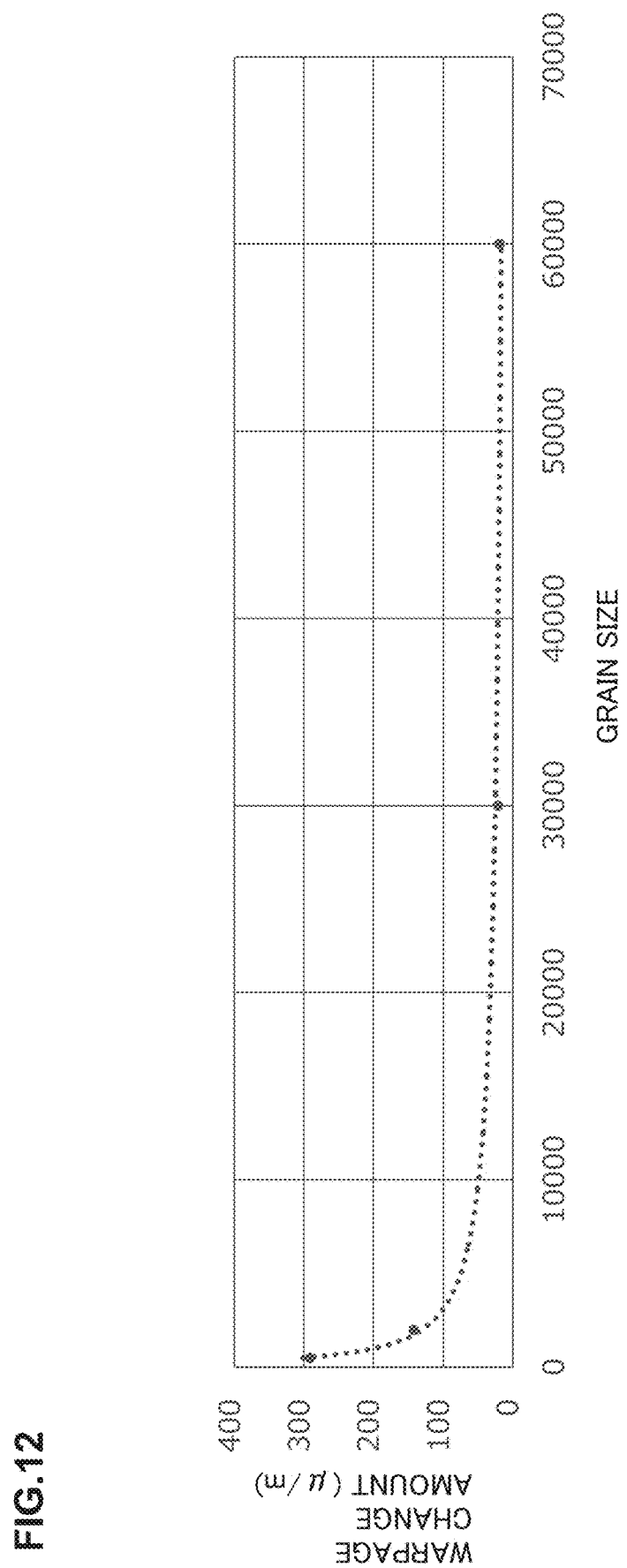
FIG. 12 is a chart illustrating a correlation between a particle size of a grindstone in the surface roughening process and the change in warpage of the wafer with respect to the surface roughening process.

FIG. 12 is a chart illustrating that there is a correlation between the particle size (grain size) of the grindstone 157 in the surface roughening process, namely, the surface roughness, more specifically, the grain size of the grindstone 157 in the surface roughening process and the change amount in warpage of the wafer W due to the process.

The present inventors carried the outer-peripheral surface roughening process on a plurality of flat wafers W with the grain size of the grindstone 157 made different for each of the wafers W, and measured the warpage of the wafer W in each of regions on the wafer W before the process and the warpage of the wafer W in each of the regions on the wafer W after the process. FIG. 12 illustrates the relation between the grain size of the grindstone 157 in the outer-peripheral surface roughening process and the change amount in warpage to the rear surface side of the wafer W due to the process. The horizontal axis in FIG. 12 indicates the grain size of the grindstone 157 in the outer-peripheral surface roughening process, and the vertical axis indicates the change amount in warpage to the wafer rear surface side due to the surface roughening process in each of the regions on the wafer W which is the maximum change amount within each of the wafers W. Note that when the correlation in FIG. 12 was obtained, the grindstones 157 of grain sizes of #500, #2000, #30000, #60000 were used, and the process conditions other than the grain size of the grindstone 157 were made common.

When the grain size of the grindstone 157 in the outer-peripheral surface roughening process was made different for each of the wafers W, though not illustrated, the shape of the wafer W after the surface roughening process was a concave shape concaved to the rear surface side of the wafer W in all of the wafers W, and the region with the maximum change amount in warpage of the wafer W before and after the surface roughening process was near the center of the wafer W.

Further, as illustrated in FIG. 12, the grain size of the grindstone 157 in the outer-peripheral surface roughening process and the maximum change amount in warpage of the wafer W due to the outer-peripheral surface roughening process were in such a correlation that when the grain size decreased, the maximum change amount increased. In other words, the surface roughness of the grindstone 157 and the maximum change amount were in such a correlation that when the surface roughness increased, the maximum change amount increased.

From the above, it is obvious that there is a correlation between the grain size, namely, the surface roughness of the grindstone in the outer-peripheral surface roughening process using the surface roughening processing apparatus 100 and the change amount in warpage of the wafer W in a direction of being concaved to the rear surface side.

Further, though not illustrated, the same result was obtained also in the central surface roughening process.

Accordingly, in the above wafer processing, instead of performing the surface roughening process at the surface roughening pressure according to the magnitude of the warpage of the wafer W, the surface roughening process may be performed by the grindstone 157 having a surface roughness according to the magnitude of the warpage of the wafer W. Also in this case, the wafer W can be appropriately flattened irrespective of the magnitude of the warpage of the wafer W. Note that if a plurality of grindstones 157 different from one another in grain size are provided on the spin mechanism 152, the grain size of the grindstone 157 to be used for the surface roughening process can be switched by spinning the stage of the spin mechanism 152.

Note that as the grain size of the grindstone 157 is larger (namely, as the abrasive grain on the front surface of the grindstone 157 is finer), the surface roughening process under the same condition results in that the grooves (scratches) formed in the rear surface of the wafer W are likely to be finer and shallower. On the other hand, as the grain size of the grindstone 157 is smaller (namely, as the abrasive grain on the front surface of the grindstone 157 is larger), the surface roughening process under the same condition results in that the grooves formed in the rear surface of the wafer W are likely to be thicker and deeper.

Modification Example the Second Embodiment

In the wafer processing in the second embodiment, the region having a shape protruding to the front surface side and having a protrusion amount of a predetermined value or more within the wafer W is decided as the surface roughening process region.

If a plurality of the regions having the shape protruding to the front surface side and having the protrusion amount of the predetermined value or more exist within the wafer W, all of the plurality of the regions may be decided as the surface roughening process regions.

Further, when the plurality of surface roughening process regions are decided, the surface roughening process condition such as the surface roughening pressure may be made different among the regions.

Note that in the case of the plurality of surface roughening process regions, the surface roughening process is performed in sequence, for example, from the region having a largest protrusion amount to the front surface side.

Other Modification Examples of the Second Embodiment

Figure 13:
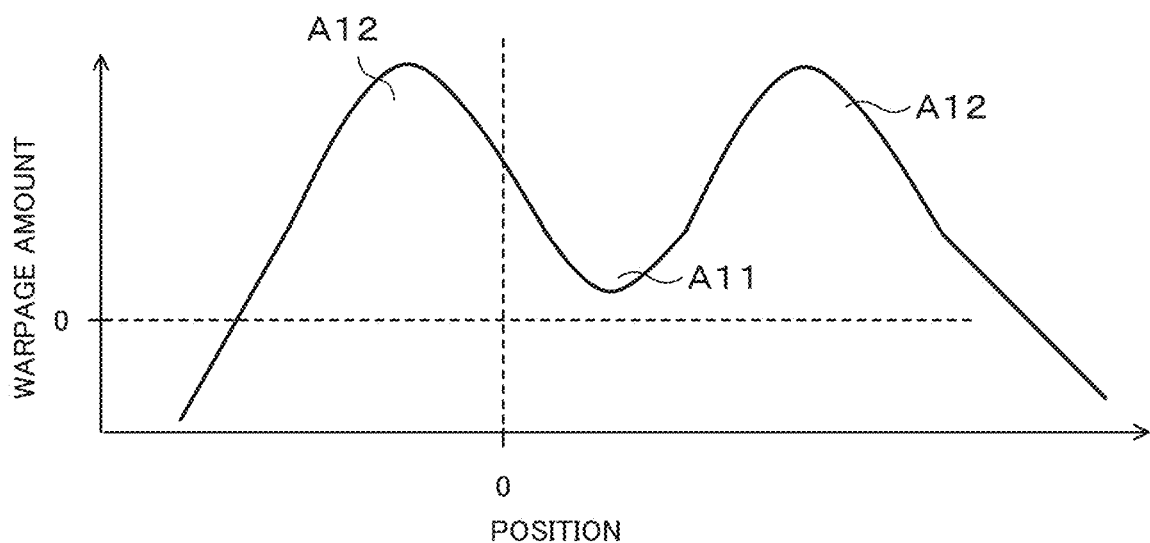
FIG. 13 is an explanatory chart of another example of the wafer being the correction object of the wafer warpage correction method according to the second embodiment.
Figure 14:
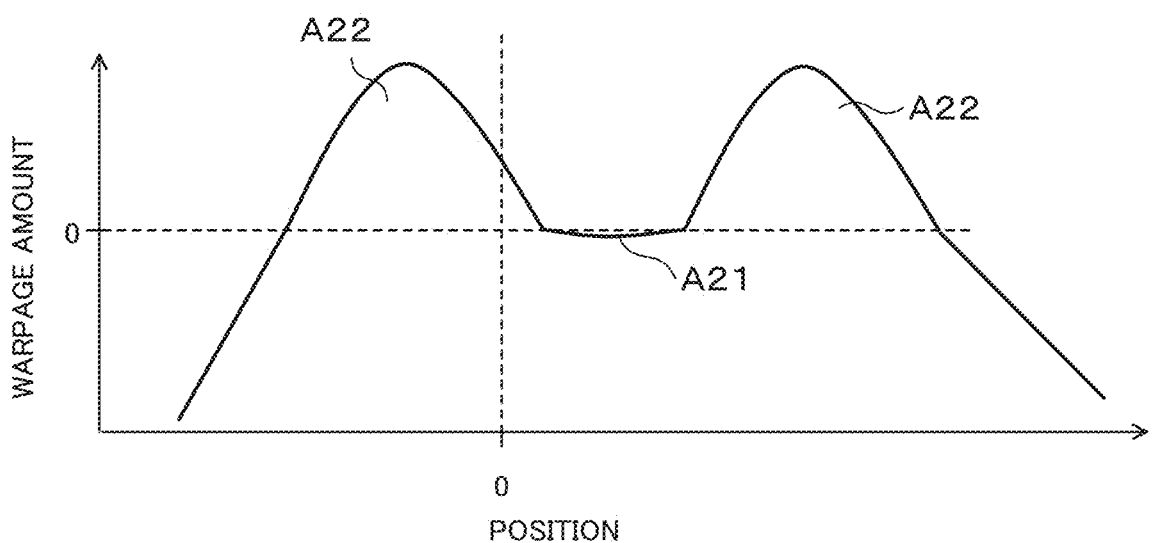
FIG. 14 is an explanatory chart of still another example of the wafer being the correction object of the wafer warpage correction method according to the second embodiment.

FIG. 13 and FIG. 14 are charts illustrating other examples of the wafer W, and FIG. 13 and FIG. 14 illustrate appearances of different wafers W. Further, FIG. 13 and FIG. 14 are charts each illustrating the relation between the distance of each of regions from the reference plane in the region and the position of the region in a cross section of a predetermined portion including the center of the wafer W.

In the above example, the region having the shape protruding in the front surface direction within the wafer W is decided as the surface roughening process region. The surface roughening process region is not limited to this example, but even a region A11 having a shape protruding in the rear surface direction as illustrated in FIG. 13 may be decided as the surface roughening process region if the protrusion amount of the region A11 to the rear surface side from the reference point is a predetermined value or less and a region A12 adjacent to the region A11 has a shape protruding in the front surface direction and has a protrusion amount of a predetermined value or more.

By subjecting the region A11 to the surface roughening process, the region A11 increases in the protrusion amount to the rear surface side due to the surface roughening process, but the protrusion amount to the front surface side of the adjacent region A12 is decreased and the protrusion amount at the outer peripheral end of the region A11 protruding to the rear surface side is decreased, whereby the warpage amount of the whole wafer W can be made to fall within an allowable range.

Further, even a region A21 not protruding in the front surface direction or in the rear surface direction as illustrated in FIG. 14 may be decided as the surface roughening process region if a region A22 adjacent to the region A21 has a shape protruding in the front surface direction and has a protrusion amount of a predetermined value or more.

By subjecting the region A21 to the surface roughening process, the region A21 comes to have a shape protruding in the rear surface direction, but the protrusion amount to the front surface side of the adjacent region A22 is decreased, whereby the warpage amount of the whole wafer W can be made to fall within an allowable range.

Note that only a portion of the rear surface of the wafer W is subjected to the surface roughening process in the above example, but when only the middle portion of the wafer W protrudes in the front surface direction, the whole rear surface of the wafer W may be subjected to the surface roughening process.

Other Examples of Correction of the Warpage of a Substrate by the Outer-Peripheral Surface Roughening Process The present inventors carried out the outer-peripheral surface roughening process under following Process Conditions 1 to 3 on a plurality of flat wafers W each having a diameter of 300 mm and calculated the warpage amount after the process in each of regions on the wafer W.

(Process Condition 1) The position of the revolution axis P2 at the start of the process: 70 mm from the center of the wafer W, the grain size of the grindstone 157: #2000

(Process Condition 2) The position of the revolution axis P2 at the start of the process: 96 mm from the center of the wafer W, the grain size of the grindstone 157: #2000

(Process Condition 3) The position of the revolution axis P2 at the start of the process: 122 mm from the center of the wafer W, the grain size of the grindstone 157: #2000

Figure 15:
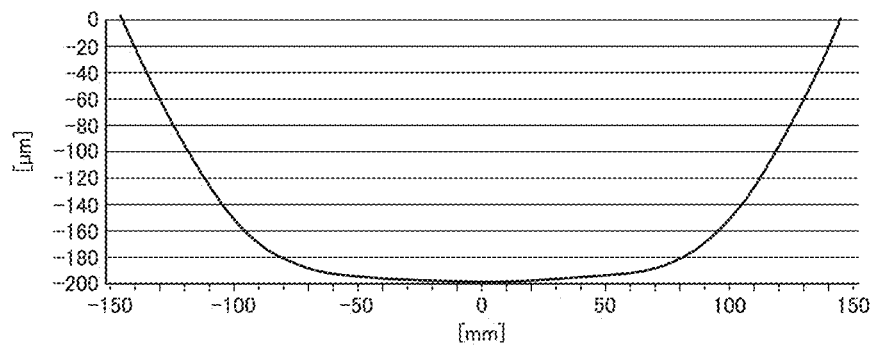
FIG. 15 is a chart illustrating a correlation between a position of a revolution axis at the start of an outer-peripheral surface roughening process and the change in warpage of the wafer with respect to the surface roughening process.
Figure 15:
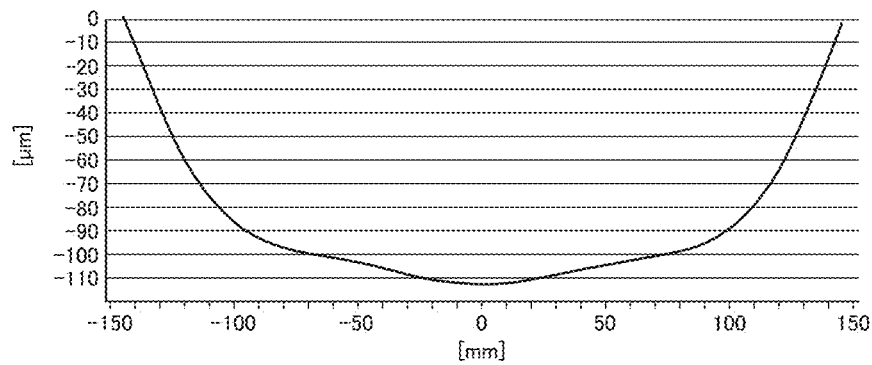
Figure 15:
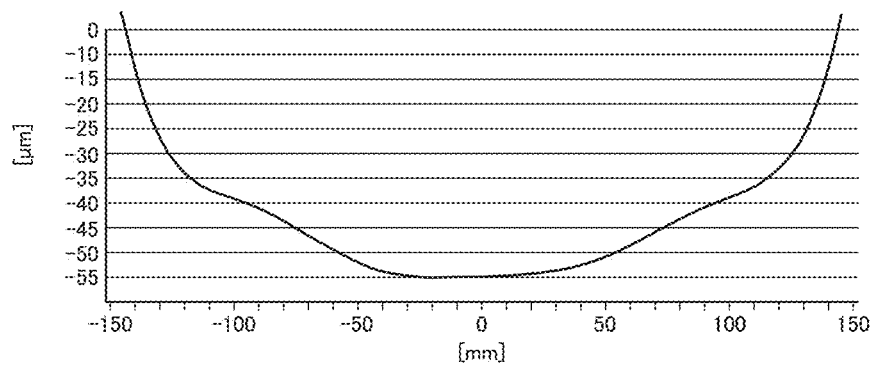

In short, the present inventors carried out the outer-peripheral surface roughening process by the grindstone 157 of a grain size of #2000 with the position of the revolution axis P2 made different for each of the wafers W, and calculated the warpage amount after the process in each of the regions on the wafer W. FIG. 15 is a chart illustrating a relation between the position of the revolution axis P2 at the start of the outer-peripheral surface roughening process and the warpage amount to the rear surface side of the wafer W due to the process. FIGS. 15(A) to (C) are for above Conditions 1 to 3, respectively.

Figure 16:
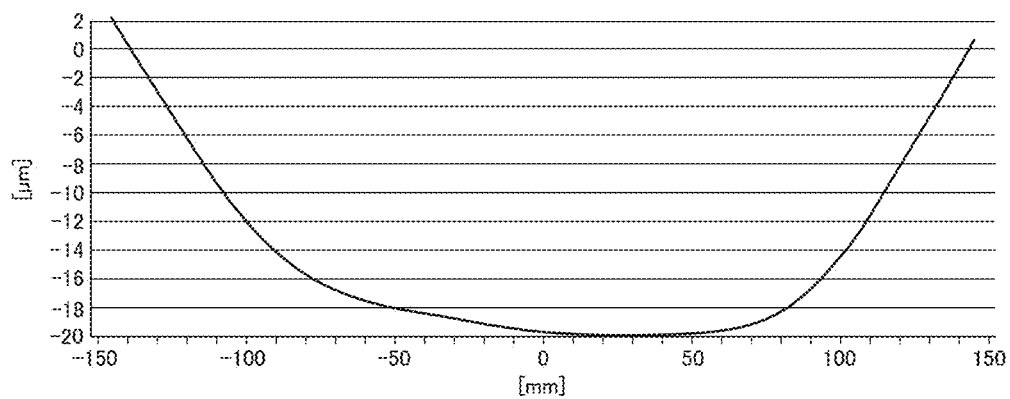
FIG. 16 is a chart illustrating an in-plane distribution of a warpage amount of the wafer after the outer-peripheral surface roughening process under Process Condition 4.

Further, the present inventors carried out the outer-peripheral surface roughening process under following Process Condition 4 on the wafer W having a diameter of 300 mm, and calculated the warpage amount after the process in each of regions on the wafer W. FIG. 16 is a chart illustrating the distribution of the warpage amount within the wafer W.

(Process Condition 4) The position of the revolution axis P2 at the start of the process: 70 mm from the center of the wafer W, the grain size of the grindstone 157: #60000

Figure 17:
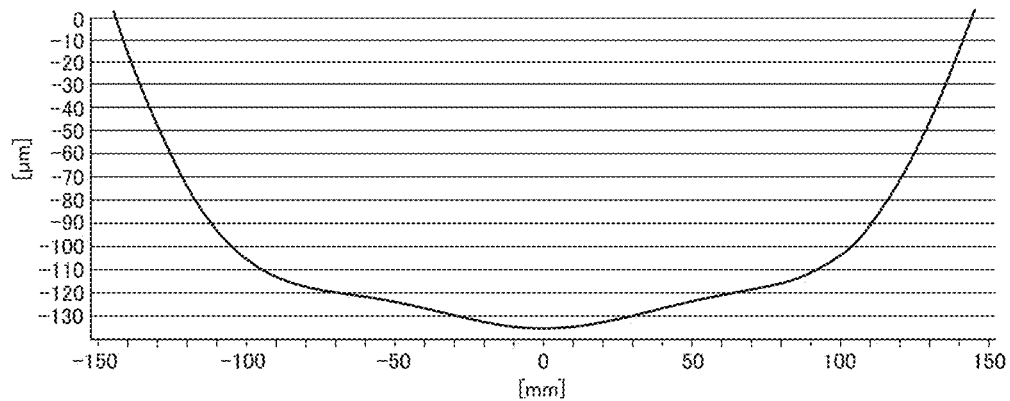
FIG. 17 is a chart illustrating the in-plane distribution of the warpage amount of the wafer after the processes in the case where the outer-peripheral surface roughening process under Process Condition 2 and the outer-peripheral surface roughening process under Process Condition 4 are performed successively in this order.

Further, the present inventors carried out the outer-peripheral surface roughening process under above Process Condition 2 and the outer-peripheral surface roughening process under above Process Condition 4 successively in this order on a flat wafer W having a diameter of 300 mm, and calculated the warpage amount after the processes in each of regions on the wafer W. FIG. 17 is a chart illustrating the distribution of the warpage amount within the wafer W.

The vertical axes in FIG. 15 to FIG. 17 indicate the warpage amount of the wafer W after the outer-peripheral surface roughening process, and when the wafer W warps in the direction of being concaved to the rear surface side, its value becomes negative. The horizontal axes indicate the position of each of portions where the warpage amount was obtained using the center of the wafer W as a reference point. Note that in the outer-peripheral surface roughening processes when the results in FIG. 15 to FIG. 17 were obtained, the wafer W was continuously spun, the position of the revolution axis P2 was made to move outward at a constant speed from the position at the start of the process, and the process was finished at the time when the outer peripheral portion of the grindstone 157 arrived at the edge of the wafer W.

As illustrated in FIG. 15, the maximum value of the warpage amount was 200 µm under Process Condition 1, 112 µm under Process Condition 2, and 55 µm under Process Condition 3. This reveals that the position of the revolution axis P2 at the start of the outer-peripheral surface roughening process and the warpage amount to the rear surface side of the wafer W are in a relation that as the position of the revolution axis P2 at the start of the outer-peripheral surface roughening process is closer to the center, the warpage amount to the rear surface side of the wafer W is larger.

Further, as illustrated in FIG. 15(B), FIG. 16, and FIG. 17, the maximum value of the warpage amount was 112 µm under Process Condition 2, and 19 µm under Process Condition 4. Further, the maximum value of the warpage amount in the case of the processes under Process Condition 2 and Process Condition 4 performed successively in this order was 131 µm which was substantially the same as the sum of the maximum value of the warpage amount under Process Condition 2 and the maximum value of the warpage amount under Process Condition 4.

Therefore, the following can be concluded.

(A) A desired change amount in warpage can be obtained by a combination of the start position of the surface roughening process, namely, the condition of the process region and the condition of the grain size (surface roughness) of the grindstone 157.

(B) A desired change amount in warpage can be obtained by successively performing surface roughening processes under a plurality of process conditions different from one another in grain size of the grindstone 157 or the like.

That is,
(a) in the wafer processing, the surface roughening process may be performed with the combination of the process conditions such as the combination of the condition of the process region and the condition of the grain size of the grindstone 157 changed according to the magnitude of the warpage of the wafer W, or
(b) in the wafer processing, the surface roughening processes may be performed under a plurality of process conditions different from one another in grain size of the grindstone 157 or the like according to the magnitude of the warpage of the wafer W.

Incidentally, if a high surface roughening pressure is applied, warpage is given to the wafer W by the surface roughening pressure in some cases, in which case, desired scratches are not formed by polishing, resulting in failure to obtain a desired change amount in warpage. Hence, by the use of the method such as the above (a), (b) or the like while setting the polishing pressure to a predetermined threshold value or less, the desired change amount in warpage can be more surely obtained.

Note that when the desired change amount in warpage is obtained by performing the surface roughening process with the combination of the process conditions changed as in the above (a), the process conditions are decided by the controller 180, for example, as follows.

How the scratches are formed, namely, the range of the warpage amount which can be coped with is decided depending on the grain size of the grindstone 157, and therefore when there are a plurality of grindstones 157 different in grain size, the grain sizes of the grindstones 157 are decided first. Next, the surface roughening pressures and the revolution speeds suitable for the grindstones 157 are decided. Then, when the process conditions such as the decided surface roughening pressures and the revolution speeds are not preferable since the polishing pressure exceeds the above threshold value or the like, or when the difference between an expected change amount in warpage and a target change amount in warpage is unignorable, (a closer condition within a preferable range is selected in the former case and) the polishing start position is changed. In place of changing the polishing start position, the controller 180 may decide the process conditions so that the surface roughening process under the plurality of process conditions are performed.

Further, as in this example, in the case of performing the surface roughening processes under the plurality of process conditions different in grain size (surface roughness) of the grindstone 157, it is preferable to perform the surface roughening process under the condition where the grain size is larger (the surface roughness is smaller) first. This is because as the grain size of the grindstone 157 is smaller, the scratches formed in the wafer W are likely to be thicker and deeper as explained above. Then, when the surface roughening process is performed under the process condition where the grain size is smaller first, large-width deep scratches are formed, and therefore small-width shallow scratches are unlikely to be formed thereafter by the grindstone 157 of a large grain size, resulting in difficulty in obtaining the desired change amount in warpage.

Note that the process conditions made by combining the grain size of the grindstone 157 and the surface roughening process region have been explained but, not limited to this, the desired change amount in warpage may be obtained under the conditions where the aforementioned polishing pressure and the spin speeds of the wafer W and the grindstone are combined.

The result of FIG. 15 further reveals that there is a correlation between the start position of the surface roughening process, namely, the condition of the process region and the change amount in warpage of the wafer W due to the outer-peripheral surface roughening process.

Accordingly, in the above wafer processing, the start position of the outer-peripheral surface roughening process may be changed according to the magnitude of the warpage of the wafer W. In this case, the wafer W can be appropriately flattened irrespective of the magnitude of the warpage of the wafer W even without changing the grain size of the grindstone 157 or the polishing pressure.

Subsequently, a semiconductor manufacturing apparatus in which the above surface roughening processing apparatus 100 is installed will be explained.

Figure 18:
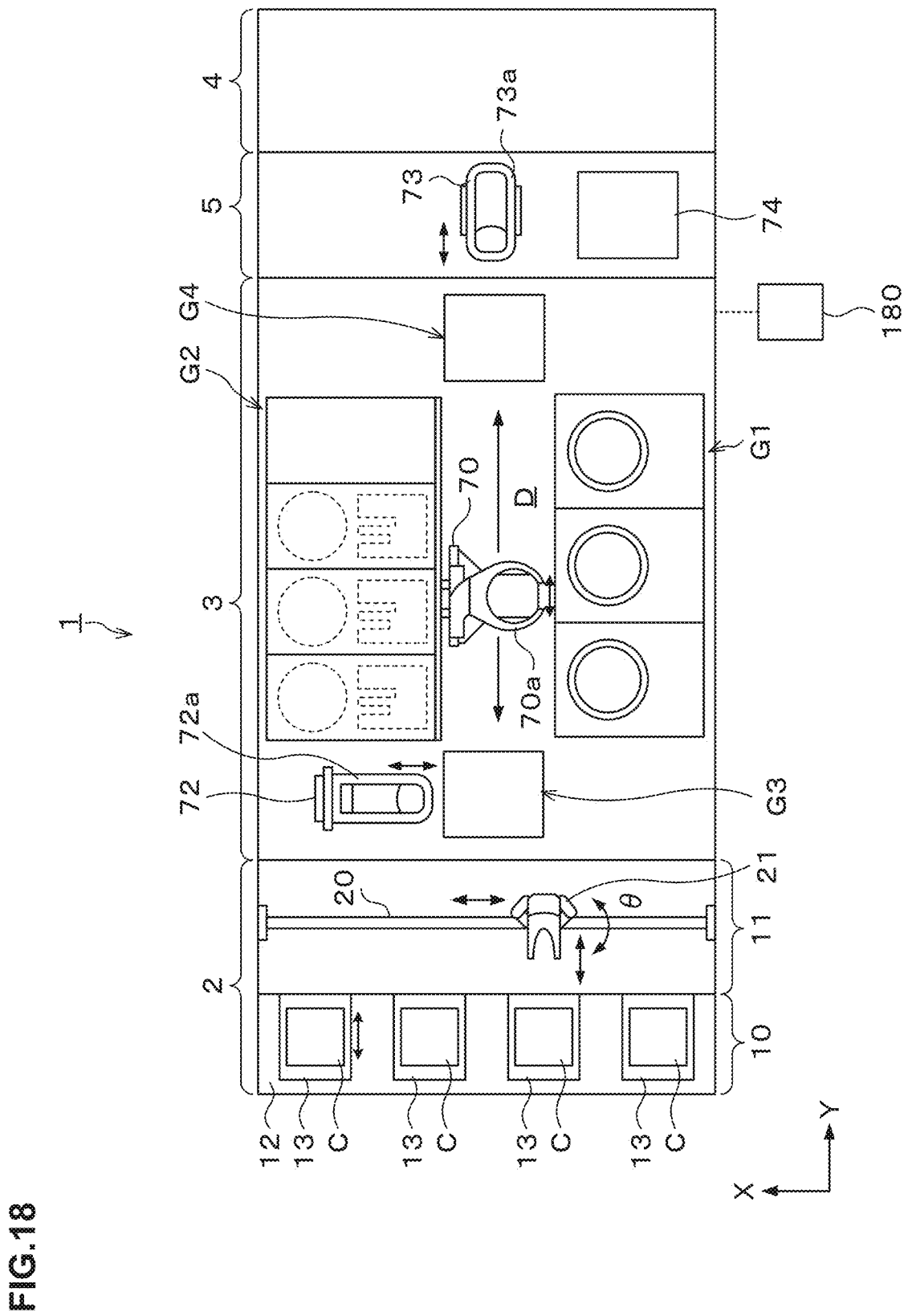
FIG. 18 is a plan view illustrating the outline of a configuration of a coating and developing treatment system in which the surface roughening processing apparatus according to this embodiment is installed.
Figure 19:
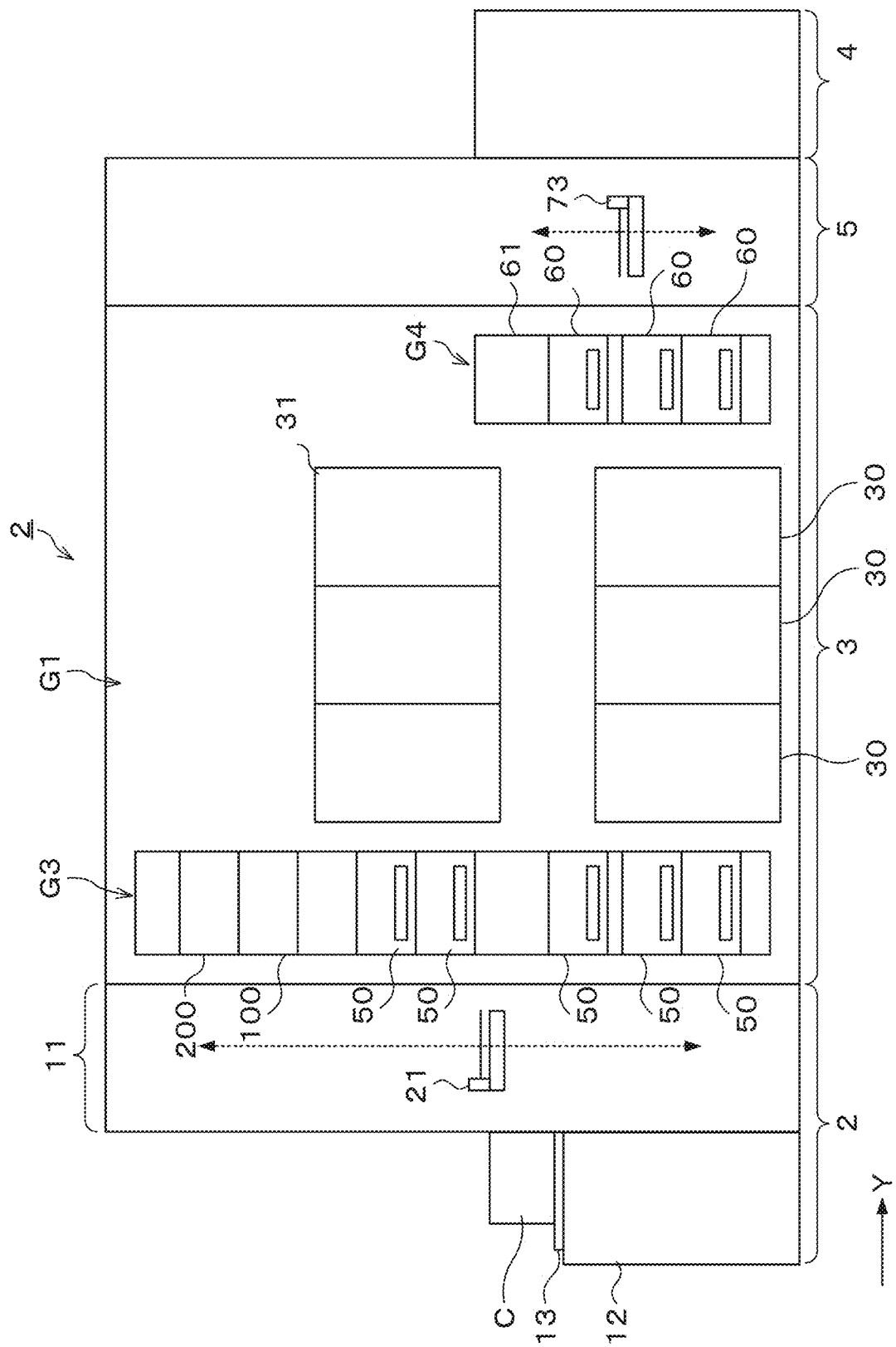
FIG. 19 is a front view of the coating and developing treatment system in FIG. 14.
Figure 20:
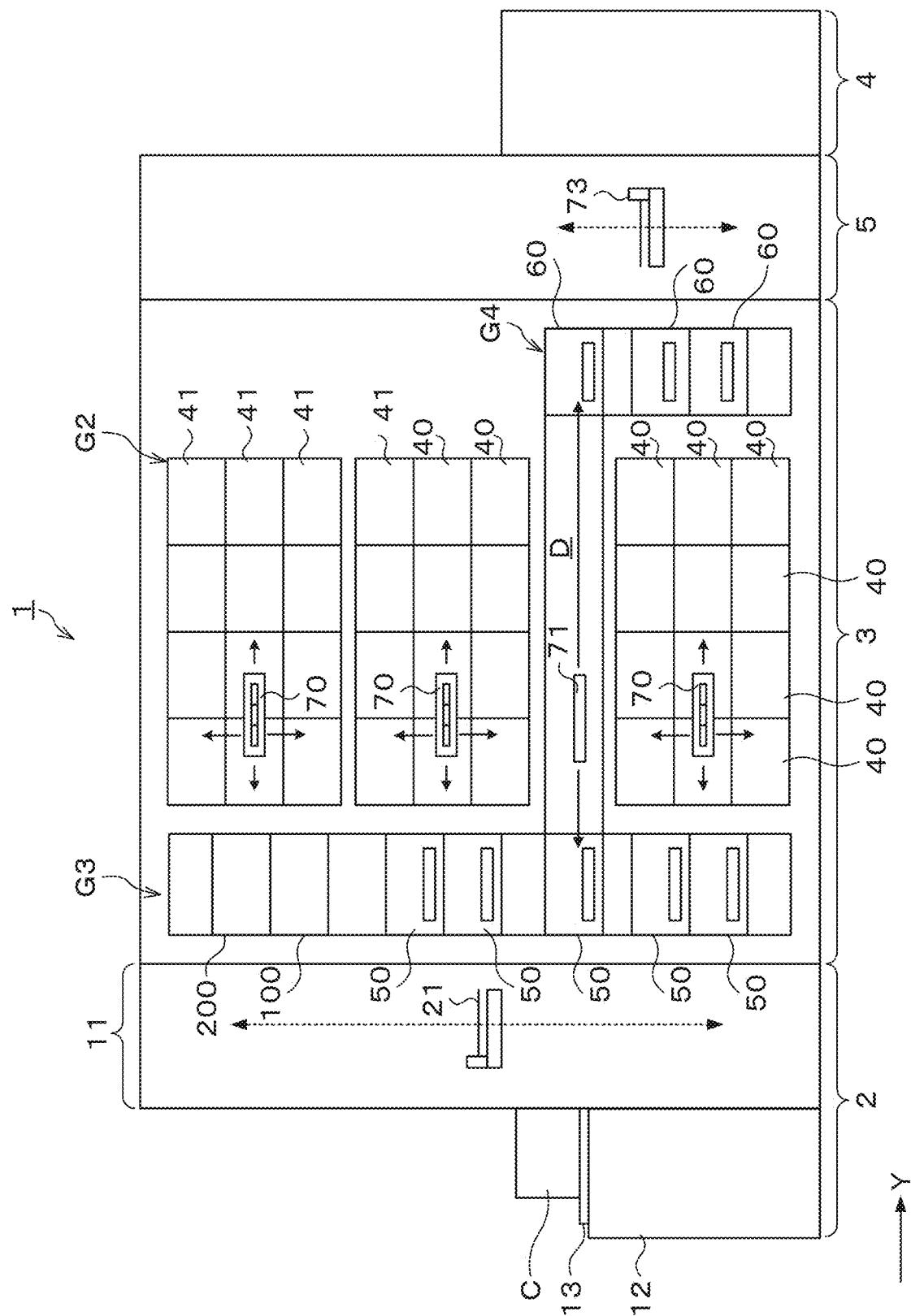
FIG. 20 is a rear view of the coating and developing treatment system in FIG. 14.

FIG. 18 is an explanatory view illustrating the outline of an internal configuration of a coating and developing treatment system 1 being an example of the semiconductor manufacturing apparatus. FIG. 19 and FIG. 20 are a front view and a rear view illustrating the outline of the internal configuration of the coating and developing treatment system 1, respectively.

The coating and developing treatment system 1 has, as illustrated in FIG. 18, a configuration in which, for example, a cassette station 2 into/out of which a cassette C is transferred from/to the outside, a treatment station 3 including a plurality of various treatment apparatuses which perform predetermined treatments such as a resist coating treatment and PEB, and an interface station 5 which delivers the wafer W to/from an exposure apparatus 4 adjacent to the treatment station 3, are integrally connected.

The cassette station 2 is divided, for example, into a cassette transfer in/out section 10 and a wafer transfer section 11. The cassette transfer-in/out section 10 is provided, for example, at an end on a Y-direction negative direction (left direction in FIG. 18) side of the coating and developing treatment system 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (an up-down direction in FIG. 18). On the stage plates 13, cassettes C can be mounted when the cassettes C are transferred in/out from/to the outside of the coating and developing treatment system 1.

In the wafer transfer section 11, a wafer transfer apparatus 21 is provided which is movable on a transfer path 20 extending in the X-direction as illustrated in FIG. 18. The wafer transfer apparatus 21 is movable also in an up-down direction and around a vertical axis (in a θ-direction), and can transfer the wafer W between the cassette C on each of the stage plates 13 and later-described delivery apparatuses included in a third block G3 in the treatment station 3.

In the treatment station 3, a plurality of, for example, four first to fourth blocks G1, G2, G3, G4 each including various apparatuses are provided. For example, the first block G1 is provided on the front side (an X-direction negative direction side in FIG. 18) in the treatment station 3, and the second block G2 is provided on the rear side (an X-direction positive direction side in FIG. 18) in the treatment station 3. Further, the third block G3 is provided on the cassette station 2 side (the Y-direction negative direction side in FIG. 1) in the treatment station 3, and the fourth block G4 is provided on the interface station 5 side (a Y-direction positive direction side in FIG. 18) in the treatment station 3.

In the first block G1, as illustrated in FIG. 19, a plurality of solution treatment apparatuses, for example, developing treatment apparatuses 30 each of which performs a developing treatment on the wafer W and resist coating apparatuses 31 each of which applies a resist solution to the wafer W to form a resist film are arranged in this order from the bottom.

For example, the developing treatment apparatus 30 and the resist coating apparatus 31 are arranged three each side by side in the horizontal direction. Note that the numbers and the arrangement of the developing treatment apparatuses 30 and the resist coating apparatuses 31 can be arbitrarily selected.

In each of the developing treatment apparatuses 30 and the resist coating apparatuses 31, spin coating of applying a predetermined treatment solution onto the wafer W is performed. In the spin coating, the treatment solution is discharged, for example, from a coating nozzle onto the wafer W and the wafer W is rotated to diffuse the treatment solution over the front surface of the wafer W.

For example, in the second block G2, as illustrated in FIG. 20, thermal treatment apparatuses 40 each of which performs thermal treatments such as heating and cooling on the wafer W and edge exposure apparatuses 41 each of which exposes the outer peripheral portion of the wafer W are provided side by side in the vertical direction and in the horizontal direction. The numbers and the arrangement of the thermal treatment apparatuses 40 and the edge exposure apparatuses 41 can also be arbitrarily selected.

For example, in the third block G3, a plurality of delivery apparatuses 50 are provided. Above the delivery apparatuses 50, the surface roughening processing apparatus 100 and a warpage measuring apparatus 200 are provided in order from the bottom. The warpage measuring apparatus 200 measures the warpage amount of each of regions of the wafer W in the region of the wafer W using a not-illustrated distance sensor or the like.

Further, in the fourth block G4, a plurality of delivery apparatuses 60 are provided.

A wafer transfer region D is formed in a region surrounded by the first block G1 to the fourth block G4 as illustrated in FIG. 18. In the wafer transfer region D, for example, a wafer transfer apparatus 70 is arranged.

The wafer transfer apparatus 70 has a transfer arm 70a movable, for example, in a Y-direction, a front-back direction, a θ-direction, and an up-down direction. The wafer transfer apparatus 70 can move in the wafer transfer region D to transfer the wafer W to a predetermined apparatus in the first block G1, the second block G2, the third block G3 and the fourth block G4 therearound. A plurality of the wafer transfer apparatuses 70 are disposed one above the other, for example, as illustrated in FIG. 20, and each of them can transfer the wafer W, for example, to predetermined apparatuses in the blocks G1 to G4 at approximately the same height.

Further, in the wafer transfer region D, a shuttle transfer apparatus 71 is provided which linearly transfers the wafer W between the third block G3 and the fourth block G4.

The shuttle transfer apparatus 71 is configured to be linearly movable, for example, in a Y-direction in FIG. 20. The shuttle transfer apparatus 71 can move in the Y-direction while supporting the wafer W, and transfer the wafer W between the delivery apparatus 50 in the third block G3 and the delivery apparatus 60 in the fourth block G4 which are at approximately the same height.

As illustrated in FIG. 18, a wafer transfer apparatus 72 is provided on the X-direction positive direction side of the third block G3. The wafer transfer apparatus 72 has a transfer arm 72a movable, for example, in the front-back direction, the θ-direction, and the up-down direction. The wafer transfer apparatus 72 can move up and down while supporting the wafer W to transfer the wafer W to each of the delivery apparatuses 50 in the third block G3.

In the interface station 5, a wafer transfer apparatus 73 and a delivery apparatus 74 are provided. The wafer transfer apparatus 73 has a transfer arm 73a movable, for example, in the Y-direction, the θ-direction, and the up-down direction. The wafer transfer apparatus 73, for example, can transfer the wafer W to/from each of the delivery apparatuses 60 in the fourth block G4, the delivery apparatus 74, and the exposure apparatus 4 while supporting the wafer W by the transfer arm 73a.

The wafer transfer region D is formed in the region surrounded by the first block G1 to the fourth block G4 as illustrated in FIG. 18. In the wafer transfer region D, for example, the plurality of the wafer transfer apparatuses 70 are arranged each of which has the transfer arm 70a movable, for example, in the Y-direction, the X-direction, the θ-direction, and the up-down direction. The wafer transfer apparatus 70 can move in the wafer transfer region D to transfer the wafer W to a predetermined apparatus in the first block G1, the second block G2, the third block G3 and the fourth block G4 therearound.

To the above coating and developing treatment system 1, the controller 180 is connected as illustrated in FIG. 18. The controller 180 controls not only the process on the wafer W in the surface roughening processing apparatus 100 but also the treatment on the wafer W in the coating and developing treatment system 1. A program which controls the treatment on the wafer W in the coating and developing treatment system 1 is stored in the program storage similarly to the program which controls the process on the wafer W in the surface roughening processing apparatus 100.

Next, the wafer treatment performed using the coating and developing treatment system 1 configured as above will be explained.

First, the wafer W is taken out of the cassette C on the cassette stage 12 and transferred to the delivery apparatus 50 in the treatment station 3 by the wafer transfer apparatus 21.

Then, the wafer W is transferred by the wafer transfer apparatus 70 to the thermal treatment apparatus 40 in the second block G2 and subjected to a temperature regulation treatment. Thereafter, the wafer W is transferred by the wafer transfer apparatus 70 to the resist coating treatment apparatus 31 in the first block G1, in which a resist film is formed on the wafer W. The wafer W is then transferred by the wafer transfer apparatus 70 to the thermal treatment apparatus 40 and subjected to a pre-baking treatment.

The wafer W is then transferred by the wafer transfer apparatus 70 to the edge exposure apparatus 41 and subjected to edge exposure processing. The wafer W is then transferred by the wafer transfer apparatus 70 to the delivery apparatus 50 in the third block G3.

The wafer W is then transferred by the shuttle transfer apparatus 71 to the delivery apparatus 60 in the fourth block G4.

The wafer W is then transferred by the wafer transfer apparatus 73 in the interface station 5 to the exposure apparatus 4 and subjected to exposure processing in a predetermined pattern.

Next, the wafer W is transferred by the wafer transfer apparatus 73 to the delivery apparatuses 60 in the fourth block G4. The wafer W is then transferred by the wafer transfer apparatus 70 to the warpage measuring apparatus 200 in the third block G3, and information about the warpage of the wafer W is acquired by the warpage measuring apparatus 200. Next, the wafer W is transferred by the wafer transfer apparatus 72 to the surface roughening processing apparatus 100 in the same third block G3. Then, the surface roughening process is performed under the surface roughening process condition decided based on the information about the warpage, on the surface roughening process region decided based on the information about the warpage of the wafer W, whereby the warpage of the wafer W is corrected. Then, the wafer W whose warpage has been corrected is transferred by the wafer transfer apparatus 70 to the thermal treatment apparatus 40 and subjected to a post-exposure baking treatment. Then, the wafer W is transferred by the wafer transfer apparatus 70 to the developing treatment apparatus 30 and developed. After the development, the wafer W is transferred by the wafer transfer apparatus 70 to the thermal treatment apparatus 40 and subjected to a post-baking treatment. Thereafter, the wafer W is transferred to the cassette C on the stage plate 13, and a series of wafer treatments are completed.

Note that the surface roughening processing apparatus 100 and the warpage measuring apparatus 200 may be provided in the interface station 5. Besides, the correction of the warpage of the wafer W is performed after the exposure processing and before the post-exposure baking treatment in the above example, but may be performed before the exposure processing or before the post-baking treatment.

The embodiments of the present invention have been explained above, but the present invention is not limited to the embodiments. It should be understood that various changes and modifications are readily apparent to those skilled in the art within the scope of the technical spirit as set forth in claims, and those should also belong to the technical scope of the present invention.

EXPLANATION OF CODES 100 surface roughening processing apparatus
120 spin chuck
130 cup
135 fixing chuck
155 surface roughening mechanism
157 grindstone
200 warpage measuring apparatus
1 coating and developing treatment system
P1 rotation axis
P2 revolution axis

What is claimed is:

1. A substrate warpage correction method for correcting warpage of a plurality of substrates, the substrate warpage correction method comprising:
for each substrate of the plurality of substrates, before a surface roughening process, measuring a warpage amount in a warpage protruding to a front surface side of a substrate, and deciding a polishing pressure in advance based on a positive correlation between the polishing pressure and the warpage amount which is measured,
for each substrate of the plurality of substrates, performing the surface roughening process on a rear surface of the substrate using a surface roughening processing apparatus configured to be able to perform the surface roughening process on the rear surface of the substrate, to form grooves in the rear surface to thereby correct the warpage of the substrate, and
after the performing of the surface roughening process on the rear surface, stopping the performing of the surface roughening process and performing a transfer-out from the surface roughening processing apparatus of the substrate with the grooves only on the rear surface, wherein
the performing of the surface roughening process on the rear surface forms grooves in the rear surface of the substrate at the polishing pressure throughout the surface roughening process for the substrate, the polishing pressure positively correlated in advance to the warpage amount in the warpage protruding to the front surface side of the substrate measured before the surface roughening process.

2. The substrate warpage correction method according to claim 1, wherein
the surface roughening processing apparatus comprises:
a first holder configured to horizontally hold a region of the substrate not overlapping with a middle portion of the rear surface of the substrate;
a second holder configured to horizontally hold the middle portion of the rear surface of the substrate, and spin the substrate around a first vertical axis;
a sliding member configured to rotate around a second vertical axis different from the first vertical axis in order to slide on the rear surface of the substrate and perform the surface roughening process;
a revolution mechanism configured to make the sliding member in rotation revolve around a vertical revolution axis different from the first vertical axis and the second vertical axis; and
a relative moving mechanism configured to horizontally move relative positions of the substrate and the vertical revolution axis.

3. The substrate warpage correction method according to claim 2, wherein
the surface roughening process is performed at a revolution speed of the sliding member by the revolution mechanism according to the warpage amount of the substrate.

4. The substrate warpage correction method according to claim 1, wherein:
the surface roughening processing apparatus comprises a sliding member configured to rotate around a vertical axis in order to slide on the rear surface of the substrate to thereby perform a process; and
the surface roughening process is performed using the sliding member, the sliding member comprising a contact surface with the rear surface of the substrate, the contact surface having a surface roughness according to the warpage amount of the substrate.

5. The substrate warpage correction method according to claim 4, wherein
the surface roughening process is performed using a plurality of the sliding members different from one another in the surface roughness, successively in order from the sliding member lower in the surface roughness.

6. The substrate warpage correction method according to claim 1, wherein
the surface roughening process is performed on a process region based on information about a distribution of the warpage of the substrate within the substrate.

7. The substrate warpage correction method according to claim 6, wherein
the process region includes a region in a shape protruding to the front surface side of the substrate.

8. The substrate warpage correction method according to claim 6, wherein the process region includes a region adjacent to a region in a shape protruding to the front surface side of the substrate.

9. A computer-readable storage medium storing a program running on a computer of a controller configured to control a surface roughening processing apparatus to cause the surface roughening processing apparatus to perform a warpage correction method for correcting warpage of a plurality of substrates, the warpage correction method comprising for each substrate of the plurality of substrates, before a surface roughening process, measuring a warpage amount in a warpage protruding to a front surface side of a substrate, and deciding a polishing pressure in advance based on a positive correlation between the polishing pressure and the warpage amount which is measured, for each substrate of the plurality of substrates, performing the surface roughening process on a rear surface of the substrate using a surface roughening processing apparatus configured to be able to perform the surface roughening process on the rear surface of the substrate, to form grooves in the rear surface to thereby correct the warpage of the substrate, and after the performing of the surface roughening process on the rear surface, stopping the performing of the surface roughening process and performing a transfer-out from the surface roughening processing apparatus of the substrate with the grooves only on the rear surface, wherein the performing of the surface roughening process on the rear surface forms grooves in the rear surface of the substrate at the polishing pressure throughout the surface roughening process for the substrate, the polishing pressure positively correlated in advance to the warpage amount in the warpage protruding to the front surface side of the substrate measured before the surface roughening process.

10. The computer-readable storage medium according to claim 9, wherein the surface roughening processing apparatus comprises:

a first holder configured to horizontally hold a region of the substrate not overlapping with a middle portion of the rear surface of the substrate;

a second holder configured to horizontally hold the middle portion of the rear surface of the substrate, and spin the substrate around a first vertical axis;

a sliding member configured to rotate around a second vertical axis different from the first vertical axis in order to slide on the rear surface of the substrate and perform the surface roughening process;

a revolution mechanism configured to make the sliding member in rotation revolve around a vertical revolution axis different from the first vertical axis and the second vertical axis; and a relative moving mechanism configured to horizontally move relative positions of the substrate and the vertical revolution axis.

11. The computer-readable storage medium according to claim 10, wherein the surface roughening process is performed at a revolution speed of the sliding member by the revolution mechanism according to the warpage amount of the substrate.

12. The computer-readable storage medium according to claim 9, wherein:

the surface roughening processing apparatus comprises a sliding member configured to rotate around a vertical axis in order to slide on the rear surface of the substrate to thereby perform a process; and in the warpage correction method, the surface roughening process is performed using the sliding member, the sliding member comprising a contact surface with the rear surface of the substrate, the contact surface having a surface roughness according to the warpage amount of the substrate.

13. The computer-readable storage medium according to claim 12, wherein the surface roughening process is performed using a plurality of the sliding members different from one another in the surface roughness, successively in order from the sliding member lower in the surface roughness.

14. The computer-readable storage medium according to claim 9, wherein the surface roughening process is performed on a process region based on information about a distribution of the warpage of the substrate within the substrate.

15. The computer-readable storage medium according to claim 14, wherein the process region includes a region in a shape protruding to the front surface side of the substrate.

16. The computer-readable storage medium according to claim 14, wherein the process region includes a region adjacent to a region in a shape protruding to the front surface side of the substrate.

17. A warpage correction apparatus for correcting warpage of a plurality of substrates configured to perform, for each substrate of the plurality of substrates, a surface roughening process on a rear surface of a substrate to form grooves in the rear surface to thereby correct the warpage of the substrate, the warpage correction apparatus comprising:

a sliding member configured to rotate around a vertical axis in order to slide on the rear surface of the substrate to thereby perform a process;

a drive relating to the sliding member; and a controller configured to for each substrate of the plurality of substrates, before the surface roughening process, measuring a warpage amount in a warpage protruding to a front surface side of a substrate, and deciding a polishing pressure in advance based on a positive correlation between the polishing pressure and the warpage amount which is measured, control the drive so as to perform at least one of: the surface roughening process by the sliding member at the polishing pressure according to the warpage amount of the substrate; the surface roughening process by the sliding member configured to spin at a spin speed according to the warpage amount of the substrate; the surface roughening process by the sliding member comprising a contact surface with the rear surface of the substrate, the contact surface having a surface roughness according to the warpage amount of the substrate; and the surface roughening process on a process region based on information about a distribution of the warpage of the substrate within the substrate, and after the performing of the surface roughening process on the rear surface, stop the performing of the surface roughening process and perform a transfer-out from the warpage correction apparatus of the substrate with the grooves only on the rear surface, wherein the performing of the surface roughening process on the rear surface forms grooves in the rear surface of the substrate at the polishing pressure throughout the surface roughening process for the substrate, the polishing pressure positively correlated in advance to the warpage amount in the warpage protruding to a front surface side of the substrate measured before the surface roughening process.

18. The warpage correction apparatus according to claim 17, wherein the surface roughening process is performed using a plurality of the sliding members different from one another in the surface roughness, successively in order from the sliding member lower in the surface roughness.

19. The warpage correction apparatus according to claim 17, wherein the surface roughening process is performed on a process region based on information about a distribution of the warpage of the substrate within the substrate.

20. The warpage correction apparatus according to claim 19, wherein the process region includes a region in a shape protruding to the front surface side of the substrate.

* * * * *